(12) United States Patent
Campbell et al.

(10) Patent No.: US 8,817,474 B2
(45) Date of Patent: Aug. 26, 2014

(54) MULTI-RACK ASSEMBLY WITH SHARED COOLING UNIT

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 13/285,116

(22) Filed: Oct. 31, 2011

(65) Prior Publication Data

US 2013/0105139 A1 May 2, 2013

(51) Int. Cl.
*H05K 7/20* (2006.01)

(52) U.S. Cl.
CPC ........ *H05K 7/20263* (2013.01); *H05K 7/20754* (2013.01)
USPC .......................................... 361/699; 361/689

(58) Field of Classification Search
CPC ................. H05K 7/20263; H05K 7/20754
See application file for complete search history.

(56) References Cited

U.S. PATENT DOCUMENTS

| 3,317,798 | A | 5/1967 | Chu et al. |
|---|---|---|---|
| 3,754,596 | A | 8/1973 | Ward, Jr. |
| 4,108,240 | A | 8/1978 | Margen et al. |
| 5,150,277 | A | 9/1992 | Bainbridge et al. |
| 5,198,962 | A | 3/1993 | Tyson |
| 5,228,197 | A | 7/1993 | Cox et al. |
| 5,467,250 | A | 11/1995 | Howard et al. |
| 5,467,609 | A | 11/1995 | Feeney |

(Continued)

FOREIGN PATENT DOCUMENTS

| DE | 19845821 B4 | 4/2000 |
|---|---|---|
| GB | 2436669 B | 5/2011 |
| WO | WO 97/47167 A1 | 12/1997 |
| WO | WO 02/37918 A1 | 5/2002 |

OTHER PUBLICATIONS

Search Report issued by the Great Britain Intellectual Property Office (IPO) for GB Application No. 1216992.6, dated Jan. 18, 2013.

(Continued)

*Primary Examiner* — Gregory Thompson
(74) *Attorney, Agent, or Firm* — Steven Chiu, Esq.; Kevin P. Radigan, Esq.; Heslin Rothenberg Farley & Mesiti, P.C.

(57) ABSTRACT

A multi-rack assembly is provided which includes first and second electronics racks. The first electronics rack includes one or more cooling units disposed within the first electronics rack, which are coupled in fluid communication with a primary coolant loop of the first electronics rack to, at least in part, provide cooled coolant to the primary coolant loop and facilitate cooling one or more first rack electronic components. The second electronics rack includes a secondary coolant loop coupled in fluid communication with the cooling unit(s) disposed within the first electronics rack. The multi-rack assembly further includes a controller to automatically provide cooled coolant to the secondary coolant loop, and wherein the controller controls flow of cooled coolant from the cooling unit(s) to the secondary coolant loop depending, at least in part, on cooling requirements of the first electronics rack.

19 Claims, 25 Drawing Sheets

(56) References Cited

U.S. PATENT DOCUMENTS

| | | | |
|---|---|---|---|
| 5,752,011 A | 5/1998 | Thomas et al. |
| 5,974,557 A | 10/1999 | Thomas et al. |
| 6,012,220 A | 1/2000 | Cornejo |
| 6,164,369 A | 12/2000 | Stoller |
| 6,349,391 B1 | 2/2002 | Petivan et al. |
| 6,374,627 B1 | 4/2002 | Schumacher et al. |
| 6,494,050 B2 | 12/2002 | Spinazzola et al. |
| 6,535,798 B1 | 3/2003 | Bhatia et al. |
| 6,587,343 B2 | 7/2003 | Novotny et al. |
| 6,704,198 B2 | 3/2004 | Replogle et al. |
| 6,763,880 B1 | 7/2004 | Shih |
| 6,807,056 B2 | 10/2004 | Kondo et al. |
| 6,819,563 B1 | 11/2004 | Chu et al. |
| 6,854,284 B2 | 2/2005 | Bash et al. |
| 6,854,287 B2 | 2/2005 | Patel et al. |
| 6,867,970 B2 | 3/2005 | Muller et al. |
| 6,896,612 B1 | 5/2005 | Novotny |
| 6,924,981 B2 | 8/2005 | Chu et al. |
| 6,927,980 B2 | 8/2005 | Fukuda et al. |
| 6,968,709 B2 | 11/2005 | Goth et al. |
| 6,973,801 B1 | 12/2005 | Campbell et al. |
| 6,997,006 B2 | 2/2006 | Kameyama et al. |
| 7,002,799 B2 | 2/2006 | Malone et al. |
| 7,011,143 B2 | 3/2006 | Corrado et al. |
| 7,086,247 B2 | 8/2006 | Campbell et al. |
| 7,106,590 B2 | 9/2006 | Chu et al. |
| 7,110,260 B2 | 9/2006 | Weber et al. |
| 7,219,247 B2 | 5/2007 | Law et al. |
| 7,236,363 B2 | 6/2007 | Belady |
| 7,312,993 B2 | 12/2007 | Bundza et al. |
| 7,315,448 B1 | 1/2008 | Bash et al. |
| 7,342,789 B2 | 3/2008 | Hall et al. |
| 7,385,810 B2 | 6/2008 | Chu et al. |
| 7,400,505 B2 | 7/2008 | Campbell et al. |
| 7,436,666 B1 | 10/2008 | Konshak |
| 7,477,514 B2 | 1/2009 | Campbell et al. |
| 7,486,513 B2 | 2/2009 | Hall et al. |
| 7,639,486 B2 | 12/2009 | Champion et al. |
| 7,641,101 B2 | 1/2010 | Campbell et al. |
| 7,647,787 B2 | 1/2010 | Belady et al. |
| 7,657,347 B2 | 2/2010 | Campbell et al. |
| 7,660,109 B2 | 2/2010 | Iyengar et al. |
| 7,660,116 B2 | 2/2010 | Claassen et al. |
| 7,660,117 B2 | 2/2010 | Werner et al. |
| 7,660,121 B2 | 2/2010 | Campbell et al. |
| 7,701,714 B2 | 4/2010 | Shabany |
| 7,716,939 B1 | 5/2010 | Morales |
| 7,757,506 B2 | 7/2010 | Ellsworth, Jr. et al. |
| 7,788,940 B2 | 9/2010 | Madara et al. |
| 7,808,780 B2 | 10/2010 | Brunschwiler et al. |
| 7,878,889 B2 | 2/2011 | Day |
| 7,885,070 B2 | 2/2011 | Campbell et al. |
| 7,903,404 B2 | 3/2011 | Tozer et al. |
| 7,903,407 B2 | 3/2011 | Matsushima et al. |
| 7,907,406 B1 | 3/2011 | Campbell et al. |
| 7,907,409 B2 | 3/2011 | Wyatt |
| 7,963,119 B2 | 6/2011 | Campbell et al. |
| 8,248,793 B2 | 8/2012 | Bash et al. |
| 8,248,801 B2* | 8/2012 | Campbell et al. ............ 361/701 |
| 8,295,047 B1* | 10/2012 | Hamburgen et al. ......... 361/699 |
| 2004/0221604 A1 | 11/2004 | Ota et al. |
| 2005/0061541 A1 | 3/2005 | Belady |
| 2005/0237714 A1 | 10/2005 | Ebermann |
| 2006/0002086 A1 | 1/2006 | Teneketges et al. |
| 2006/0037736 A1 | 2/2006 | Heyman |
| 2006/0065000 A1 | 3/2006 | Belady |
| 2006/0139877 A1 | 6/2006 | Germagian et al. |
| 2007/0101334 A1 | 5/2007 | Atyam et al. |
| 2007/0119569 A1 | 5/2007 | Campbell et al. |
| 2007/0227709 A1* | 10/2007 | Upadhya et al. ............. 165/121 |
| 2007/0227710 A1 | 10/2007 | Belady et al. |
| 2008/0123288 A1 | 5/2008 | Hillis |
| 2008/0148746 A1 | 6/2008 | Yanik et al. |
| 2008/0198549 A1 | 8/2008 | Rasmussen et al. |
| 2008/0232064 A1 | 9/2008 | Sato et al. |
| 2008/0245083 A1 | 10/2008 | Tutunoglu et al. |
| 2009/0080173 A1 | 3/2009 | Porter et al. |
| 2009/0086428 A1 | 4/2009 | Campbell et al. |
| 2009/0086432 A1 | 4/2009 | Campbell et al. |
| 2009/0122483 A1 | 5/2009 | Hall |
| 2009/0126909 A1 | 5/2009 | Ellsworth, Jr. et al. |
| 2009/0133866 A1* | 5/2009 | Campbell et al. ............ 165/288 |
| 2009/0156114 A1 | 6/2009 | Ahladas et al. |
| 2009/0207567 A1 | 8/2009 | Campbell et al. |
| 2009/0225514 A1 | 9/2009 | Correa et al. |
| 2009/0241578 A1 | 10/2009 | Carlson et al. |
| 2009/0260384 A1 | 10/2009 | Champion et al. |
| 2010/0033931 A1 | 2/2010 | Miyazawa et al. |
| 2010/0053879 A1 | 3/2010 | Miyamoto et al. |
| 2010/0067193 A1 | 3/2010 | Arimilli et al. |
| 2010/0078160 A1 | 4/2010 | Novotny et al. |
| 2010/0101759 A1* | 4/2010 | Campbell et al. ............ 165/80.4 |
| 2010/0263855 A1 | 10/2010 | Arimilli et al. |
| 2011/0051372 A1 | 3/2011 | Barringer et al. |
| 2011/0056675 A1 | 3/2011 | Barringer et al. |
| 2011/0060470 A1 | 3/2011 | Campbell et al. |
| 2011/0205705 A1 | 8/2011 | Graybill et al. |
| 2011/0277967 A1 | 11/2011 | Fried et al. |
| 2013/0104383 A1 | 5/2013 | Campbell et al. |
| 2013/0104399 A1 | 5/2013 | Campbell et al. |
| 2013/0107447 A1 | 5/2013 | Campbell et al. |

OTHER PUBLICATIONS

Campbell et al., Office Action for U.S. Appl. No. 13/285,105, filed Oct. 31, 2011 (U.S. Patent Publication No. 2013/0107447 A1), dated May 10, 2013 (42 pgs.).

Campbell et al., Office Action for U.S. Appl. No. 13/684,736, filed Nov. 26, 2012 (U.S. Patent Publication No. 2013/0104399 A1), dated Jul. 23, 2013 (31 pgs.).

Delia et al., "System Cooling Design for the Water-Cooled IBM Enterprise System/900 Processors", IBM Journal of Research and Development, vol. 36, No. 4, pp. 791-803 (Jul. 1992).

Nelson et al. "Thermal Performance of an Integral Immersion Cooled Multichip Module Package", IEEE on Components, Packages, and Manufacturing Technology—Part A, vol. 17, No. 3, pp. 405-412 (Sep. 1994).

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Morgan, "IBM Hints at Triple Redundancy in Power6", (http://www.itjungle.com/breaking/bn032906-story-1.html) (Mar. 29, 2006).

Ellsworth, Jr. et al., "The Evolution of Water Cooling for IBM Larger Server Systems: Back to the Future", IEEE, Piscataway, NJ, 2008 11th Intersociety Conference on Thermal and Thermomechanical Phenomena in Electronic Systems (ITHERM '08), pp. 266-274 (May 2008).

Campbell et al. "Automatically Reconfigurable Liquid-Cooling Apparatus for an Electronics Rack", U.S. Appl. No. 12/947,302, filed Nov. 16, 2010.

Eckberg et al. "Multi-Rack, Door-Mounted Heat Exchanger", U.S. Appl. No. 13/115,404, filed May 25, 2011.

Campbell et al., Notice of Allowance for U.S. Appl. No. 13/285,105, filed Oct. 31, 2011 (U.S. Patent Publication No. 2013/0107447 A1), dated Nov. 6, 2013 (22 pages).

Campbell et al., Notice of Allowance for U.S. Appl. No. 13/684,736, filed Nov. 26, 2012 (U.S. Patent Publication No. 2013/0104399 A1), dated Nov. 7, 2013 (15 pages).

Campbell et al., Notice of Allowance for U.S. Appl. No. 13/684,753, filed Nov. 26, 2012 (U.S. Patent Publication No. 2013/0104383 A1), dated Mar. 27, 2014 (9 pages).

* cited by examiner

MULTI-RACK ASSEMBLY WITH SHARED COOLING UNIT

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device. However, this approach is becoming problematic at the rack level in the context of a computer installation (i.e., data center).

The sensible heat load carried by the air exiting the rack is stressing the capability of the room air-conditioning to effectively handle the load. This is especially true for large installations with "server farms", or large banks of computer racks located close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment, whether to air or other liquid.

BRIEF SUMMARY

The shortcomings of the prior art are overcome and additional advantages are provided through the provision of a multi-rack assembly which includes a first electronics rack, a second electronics rack, and a controller. The first electronics rack includes one or more first rack electronic components to be cooled, and at least one cooling unit disposed within the first electronics rack and coupled in fluid communication with a primary coolant loop of the first electronics rack to, at least in part, facilitate cooling of the at least one first rack electronic component of the first electronics rack. The cooling unit(s) provides cooled coolant to the primary coolant loop. The second electronics rack includes a secondary coolant loop coupled in fluid communication with the at least one cooling unit disposed within the first electronics rack, wherein the at least one cooling unit disposed within the first electronics rack provides cooled coolant to the secondary coolant loop to, at least in part, facilitate extracting heat generated within the second electronics rack. The controller automatically controls flow of cooled coolant from the at least one cooling unit in the first electronics rack to the secondary coolant loop in the second electronics rack depending, at least in part, on cooling requirements of the first electronics rack.

In another aspect, a cooling apparatus is provided which includes a first heat exchange assembly, a second heat exchange assembly, a primary coolant loop, a secondary coolant loop, at least one cooling unit, and a controller. The first heat exchange assembly is configured to mount within a first electronics rack to facilitate extraction of heat generated within the first electronics rack, and the second heat exchange assembly is configured to mount to a second electronics rack to facilitate extraction of heat generated within the second electronics rack. The primary coolant loop is coupled in fluid communication with the first heat exchange assembly and the secondary coolant loop is coupled in fluid communication with the second heat exchange assembly. The at least one cooling unit is configured to mount within the first electronics rack and is coupled in fluid communication with the primary coolant loop and the secondary coolant loop. The at least one cooling unit provides cooled coolant to the primary coolant loop to facilitate extraction by the first heat exchange assembly of heat generated within the first electronics rack. The controller automatically controls flow of cooled coolant from the at least one cooling unit in the first electronics rack through the secondary coolant loop to the second heat exchange assembly associated with the second electronics rack depending, at least in part, on cooling requirements of the first electronics rack.

In a further aspect, a method of fabricating a cooling apparatus is provided which includes: associating a first heat exchange assembly with a first electronics rack comprising at least one first rack electronic component to be cooled; associating a second heat exchange assembly with a second electronics rack comprising at least one second rack electronic component to be cooled; providing at least one cooling unit within the first electronics rack; providing a primary coolant loop within the first electronics rack coupling in fluid communication the at least one cooling unit and the first heat exchange assembly to, at least in part, facilitate extraction of heat generated within the first electronics rack; providing a secondary coolant loop coupled in fluid communication with the at least one cooling unit disposed within the first electronics rack and coupled in fluid communication with the second heat exchange assembly disposed within the second electronics rack; and providing a controller to automatically control flow of cooled coolant from the at least one cooling unit in the first electronics rack to the second heat exchange assembly via the secondary coolant loop depending, at least in part, on cooling requirements of the first electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
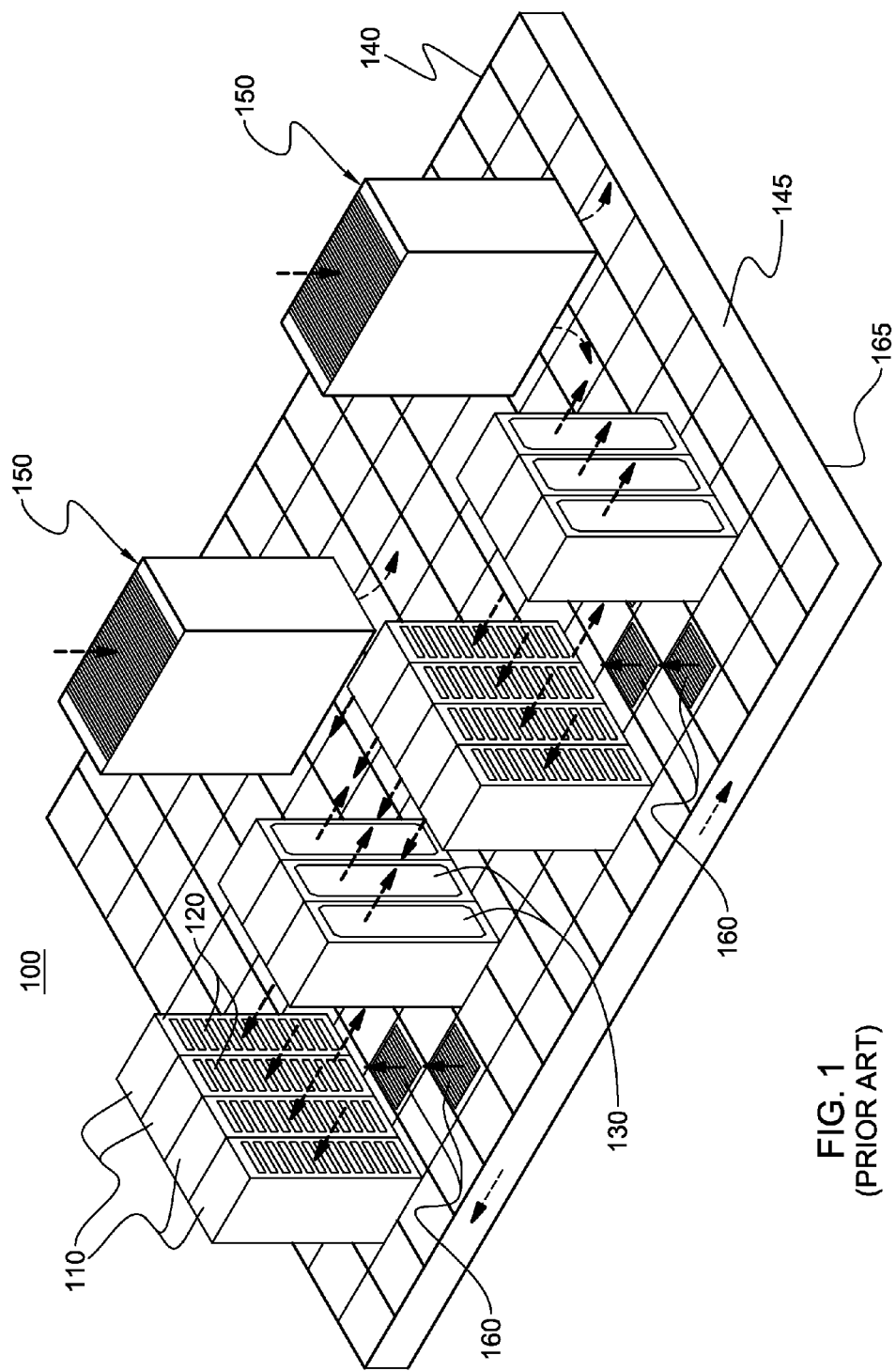
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with the rack-mounted electronic drawers of a multi-drawer rack unit and blades of a blade center system being two examples of systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubings (such as copper or other tubing) in thermal or mechanical contact with a plurality of air-cooled cooling fins. Size, configuration and construction of the air-to-liquid heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple air-cooled electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between a raised floor 140 and a base or sub-floor 165 of the room. Cooled air is taken in through louvered covers at air inlet sides 120 of the electronics racks and expelled through air outlet sides 130 of the electronics racks. Each air-cooled electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more air-conditioning units 150, also disposed within data center 100. Room air is taken into each air-conditioning unit 150 near an upper portion thereof. This room air comprises in part exhausted air from the "hot" air aisles of the data center defined by opposing air outlet sides 130 of the electronics racks 110.

Figure 2:
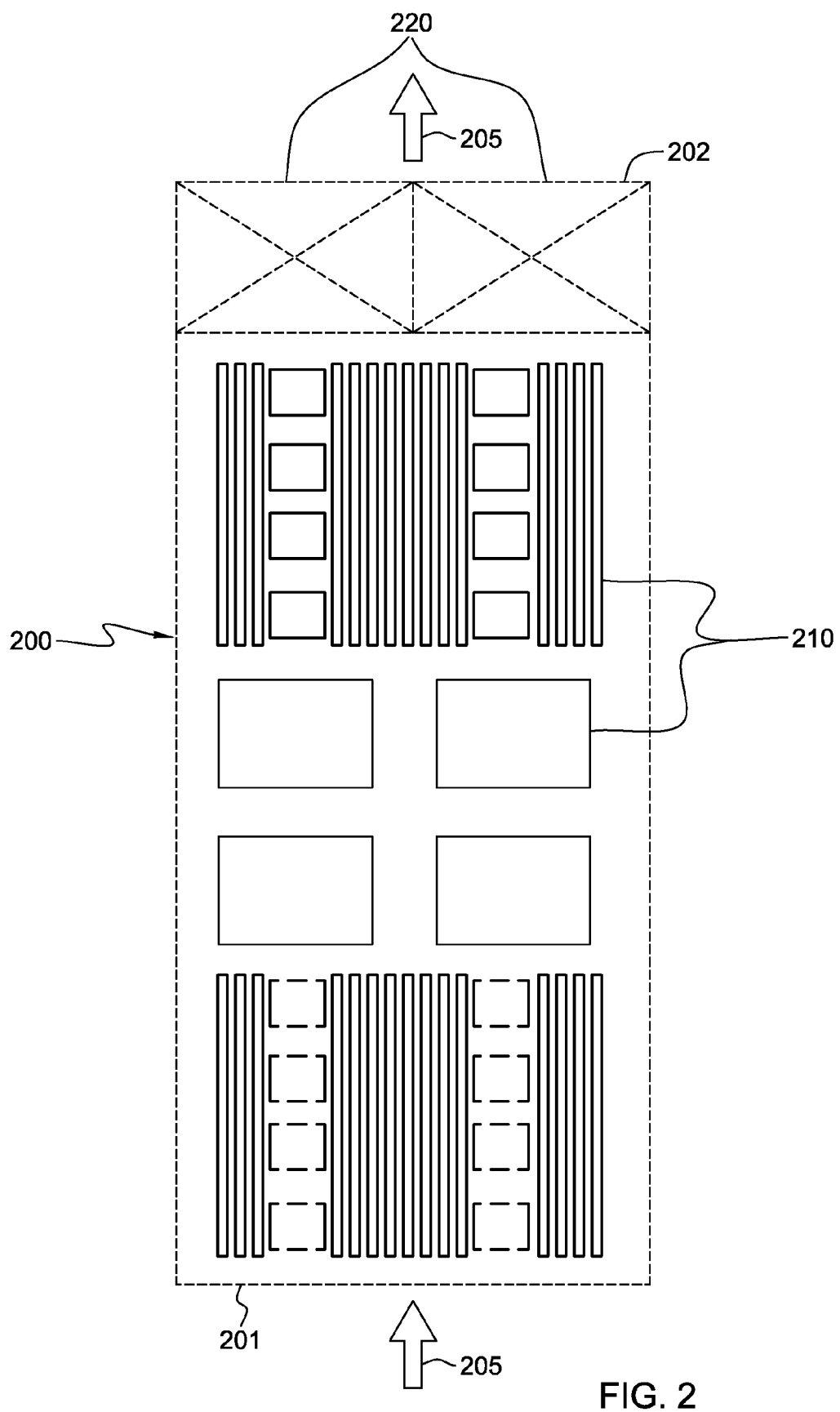
FIG. 2 is a top plan view of one embodiment of an electronic subsystem layout of an air-cooled electronics rack utilizing air-cooling of electronic components of the electronic subsystem, in accordance with one or more aspects of the present invention.

FIG. 2 depicts one embodiment of an electronic subsystem 200 layout for an air-cooled electronics rack, such as air-cooled electronics rack 110 of FIG. 1. The electronic subsystem 200 includes a plurality of heat-generating electronic components 210 which are air-cooled by an airflow 205 ingressing through an air inlet side 201, and egressing via an air outlet side 202 of electronic subsystem 200. One or more air-moving devices 220 facilitate airflow 205 through electronic subsystem 200. In operation, cool air enters via air inlet side 201, becomes heated by the heat-generating electronic components 210 of electronic subsystem 200, and is exhausted out the air outlet side 202 of electronic system 200 as heated exhaust air.

Due to the ever increasing airflow requirements through the electronics racks, and limits of air distribution within the typical computer room installation, recirculation problems within the room may occur. This recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from an air outlet side of a rack unit to an air inlet side. This recirculating flow is often very complex in nature, and can lead to significantly higher rack inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 15-32° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 3:
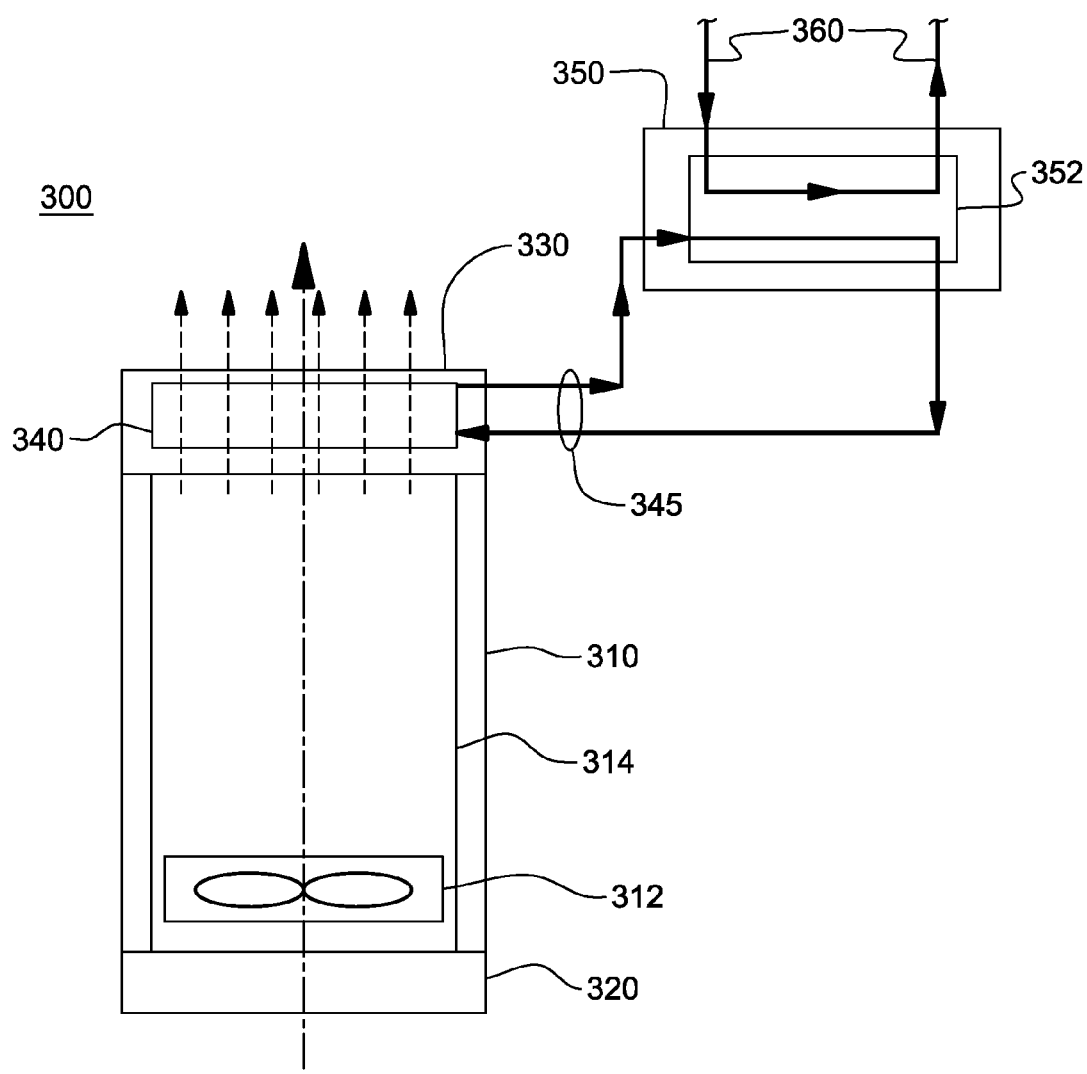
FIG. 3 is a top plan view of one embodiment of an electronics rack with an air-to-liquid heat exchanger mounted to an air outlet side door thereof, and with extracted heat being rejected to facility coolant via a coolant distribution unit, in accordance with one or more aspects of the present invention.

FIG. 3 depicts one embodiment of a cooled electronic system, generally denoted 300. In this embodiment, electronic system 300 includes an electronics rack 310 having an inlet door 320 and an outlet door 330, which have openings to allow for the ingress and egress of external air, respectively, through the air inlet side and air outlet side of electronics rack 310. The system further includes at least one air-moving device 312 for moving external air across at least one electronic system or component 314 positioned within the electronics rack. Disposed within outlet door 330 is an air-to-liquid heat exchanger 340 across which the inlet-to-outlet airflow through the electronics rack passes. A coolant distribution unit 350 is used to buffer the air-to-liquid heat exchanger from facility coolant in a facility coolant loop. Air-to-liquid heat exchanger 340 removes heat from the exhausted inlet-to-outlet airflow through the electronics rack via circulating system coolant in system coolant loop 345, for rejection in coolant distribution unit 350 to facility coolant in a facility coolant loop 360, that is, via a liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 3, a system coolant loop 345 couples air-to-liquid heat exchanger 340 to coolant distribution unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In one implementation, the inlet and outlet plenums of the air-to-liquid heat exchanger mount within the door and are coupled to coolant supply and return manifolds disposed beneath a raised floor. Alternatively, system coolant supply and return manifolds or headers for the air-to-liquid heat exchangers may be mounted over the electronics racks within the data center. In such an embodiment, system coolant enters and exits the respective coolant inlet and outlet plenums at the top of the rack door, using flexible coolant supply and return hoses, which are at least partially looped and are sized to facilitate opening and closing of the rack door (containing the air-to-liquid heat exchanger). Additionally, structures may be provided at the ends of the hoses to relieve stress at the hose ends, which results from opening or closing of the door.

Figure 4:
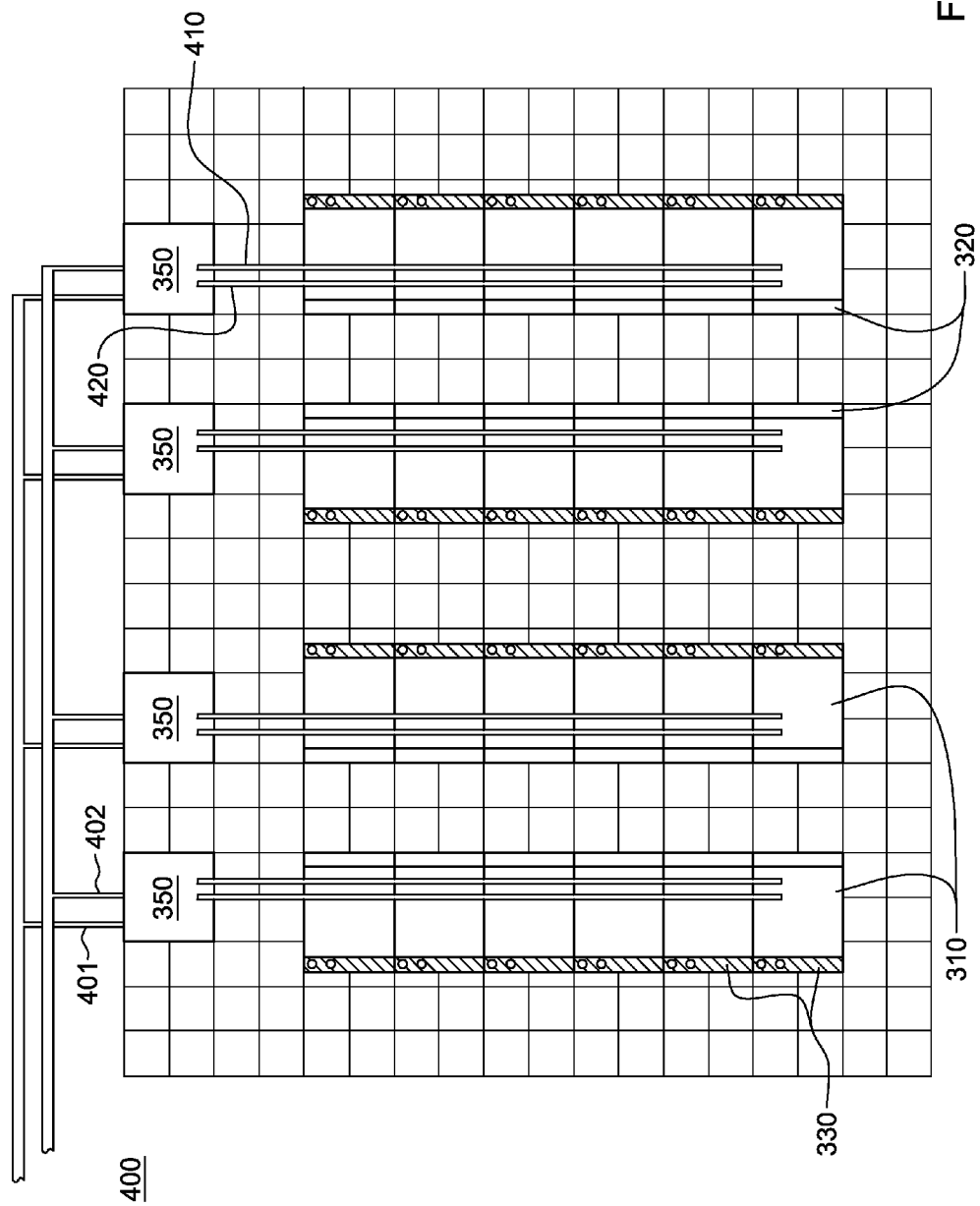
FIG. 4 depicts one embodiment of a data center layout comprising multiple coolant distribution units providing liquid coolant to a plurality of air-to-liquid heat exchangers associated with a plurality of electronics racks disposed in rows in the data center, and which is to be modified to include one or more multi-rack assemblies, in accordance with one or more aspects of the present invention.

FIG. 4 is a plan view of one embodiment of a data center, generally denoted 400, employing cooled electronics systems. Data center 400 includes a plurality of rows of electronics racks 310, each of which includes an inlet door 320 at the air inlet side, and a hinged outlet door 330 at the air outlet side, such as described above in connection with the embodiment of FIG. 3. In this embodiment, each outlet door 330 supports an air-to-liquid heat exchanger and system coolant inlet and outlet plenums. Multiple coolant conditioning units 350, referred to hereinbelow as pumping units, are disposed within the data center (along with possibly one or more air-conditioning units (not shown)). As shown, in one embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as water, is provided via a system coolant supply header 410 extending over the respective row of electronics racks, and is returned via a system coolant return header 420 also extending over the respective row of electronics racks. In one embodiment, the system coolant supply and return headers 410, 420 are hard-plumbed within the data center, and preconfigured to align over and include branch lines extending towards electronics racks in a respective row of electronics racks.

Figure 5:
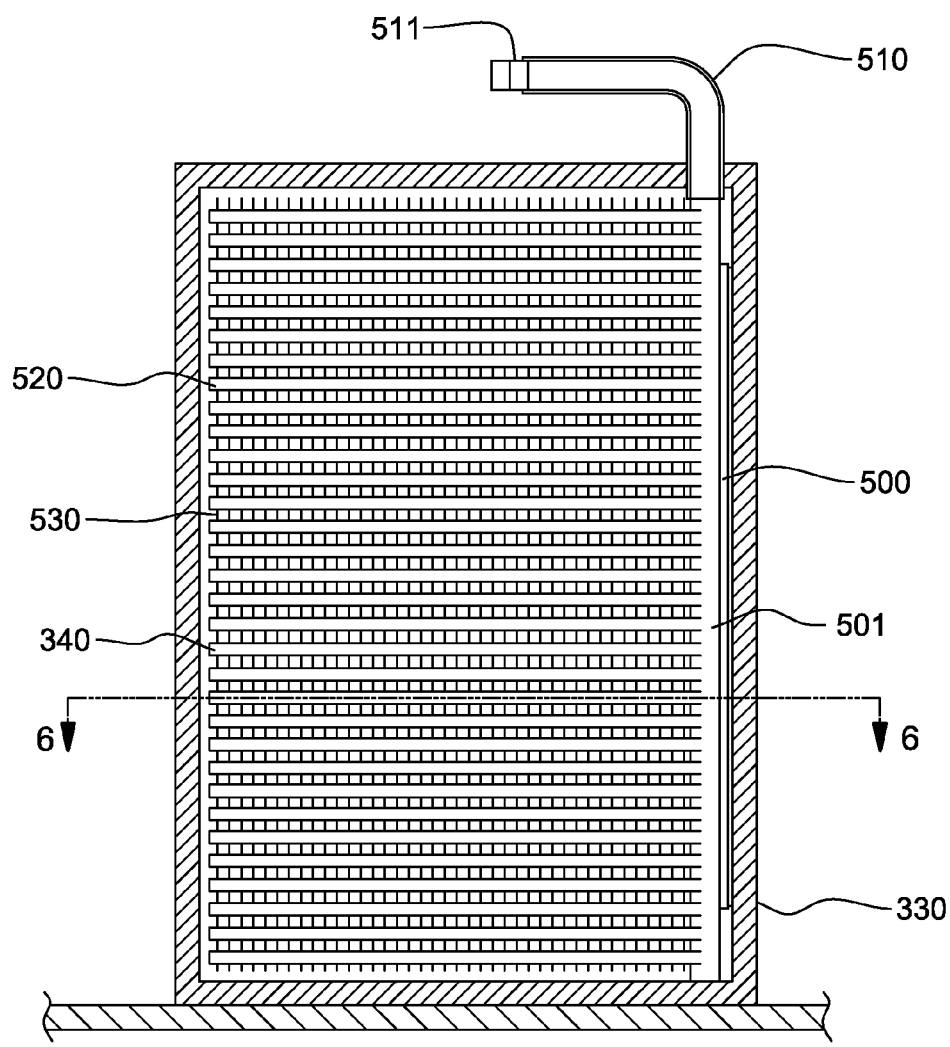
FIG. 5 is a partial cross-sectional elevational view of one embodiment of a rack door with an air-to-liquid heat exchanger mounted thereto, taken along line 5-5 in FIG. 6, in accordance with one or more aspects of the present invention.
Figure 6:
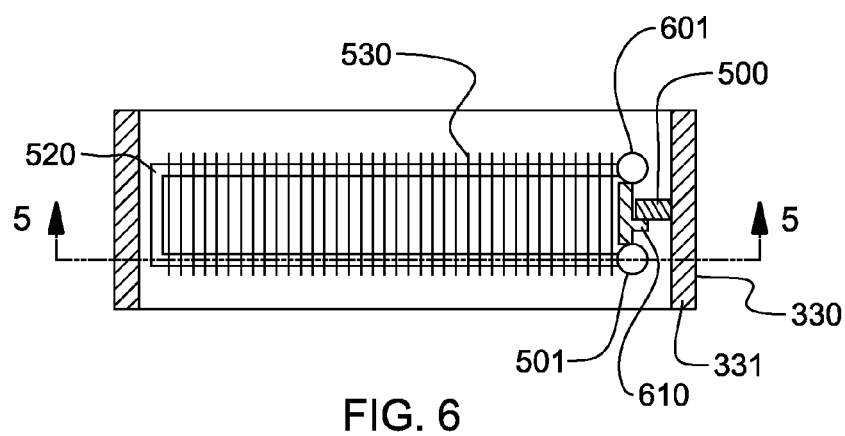
FIG. 6 is a cross-sectional plan view of the rack door and air-to-liquid heat exchanger of FIG. 5, taken along line 6-6 in FIG. 5, in accordance with one or more aspects of the present invention.

FIGS. 5 & 6 depict one embodiment of outlet door 330 supporting air-to-liquid heat exchanger 340, and system coolant inlet and outlet plenums 501, 601. Referring to both figures collectively, outlet door frame 331 supports a rigid flap 500, which attaches, for example, by brazing or soldering, to a plate 610 secured between the system coolant inlet plenum 501 and system coolant outlet plenum 601.

In FIG. 5, right angle bend 510 is shown disposed at the top of system coolant inlet plenum 501. This right angle bend defines a horizontal inlet plenum portion, which extends above the top of door 330. The coolant inlet to system coolant inlet plenum 501 is coupled to a connect coupling 511 for facilitating connection thereof to the respective supply hose, as described above. In this embodiment, the air-to-liquid heat exchanger comprises a plurality of horizontally-oriented heat exchange tube sections 520. These heat exchange tube sections 520 each comprise a coolant channel having an inlet and an outlet, with each coolant channel being coupled to the system coolant inlet plenum 501 and each coolant channel outlet being coupled to the system coolant outlet plenum 601. A plurality of fins 530 are attached to horizontally-oriented heat exchange tube sections 520 for facilitating transfer of heat from air passing across the air-to-liquid heat exchanger to coolant flowing through the plurality of heat exchange tube sections 520. In one embodiment, the plurality of fins are vertically-oriented, rectangular fins attached to horizontally-oriented heat exchange tube sections 520.

Figure 7A:
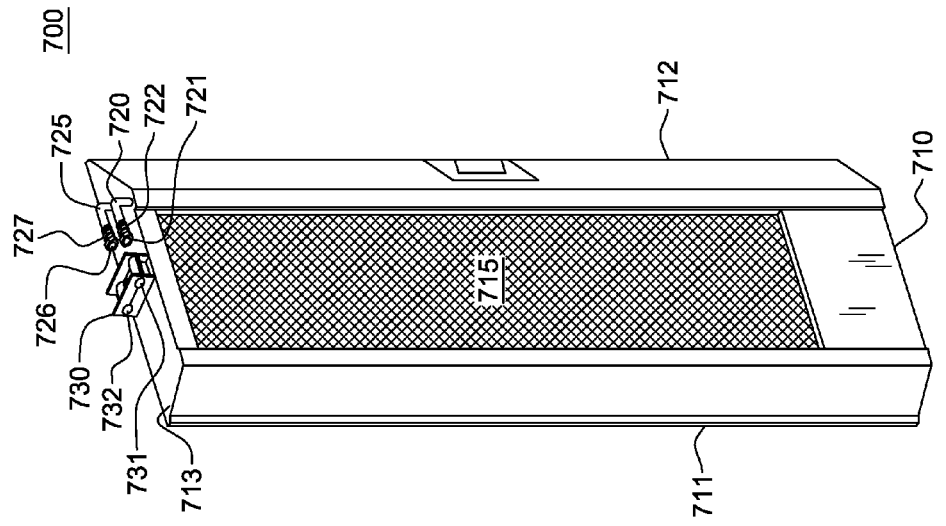
FIGS. 7A & 7B depict interior and exterior views, respectively, of one embodiment of a rack door having an air-to-liquid heat exchanger disposed therein, in accordance with one or more aspects of the present invention.
Figure 7B:
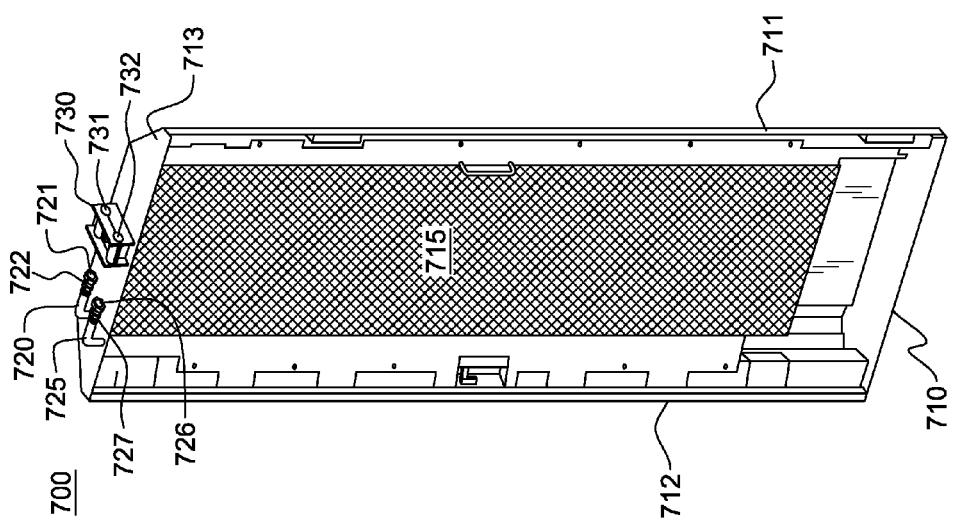

By way of specific example, FIGS. 7A & 7B depict one embodiment of an electronics rack door 700 with a cooling apparatus mounted thereto, which as explained below, may be configured and sized for a multi-rack assembly, in accordance with one or more aspects of the present invention. This cooling apparatus includes an air-to-liquid heat exchanger 715 across which exhausting air from the air outlet side of the electronics rack(s) (not shown) flows. As illustrated, air-to-liquid heat exchanger 715 is disposed within an airflow opening in a door frame 710 which vertically mounts along a first edge 711 to the electronics rack(s). The cooling apparatus includes a system coolant inlet plenum 720 and system coolant outlet plenum 725 which (in one embodiment) extend vertically into and along a second edge 712 of heat exchanger door 700. As illustrated, second edge 712 of heat exchanger door 700 is in opposing relation to first edge 711, which hingedly mounts to an electronics rack. Thus, in this embodiment, the system coolant inlet and outlet plenums 720, 725 are disposed remote from the edge of the heat exchanger door mounted to the electronics rack(s). This will advantageously reduce stress (in an overhead supply and return implementation) on the system coolant supply and return hoses, during opening or closing of the door, particularly when the first ends of the supply and return hoses are affixed in parallel relation on top of the rack door to extend towards the first edge of the rack door. As illustrated, system coolant inlet plenum 720 includes a coolant inlet 721 which has a connect coupling 722 for facilitating fluid tight connection to the system coolant supply hose (not shown). Similarly, system coolant outlet plenum 725 includes a coolant outlet 726 with a connect coupling 727 to facilitate fluid tight connection to a system coolant return hose. In one embodiment, these connect couplings are quick connect couplings such as the commercially available quick connect couplings offered by Colder Products Company, of St. Paul, Minn., U.S.A., or Parker Hannifin, of Cleveland, Ohio, U.S.A.

FIGS. 7A & 7B also illustrate one embodiment of a stress relief structure 730 attached to an upper surface 713 of door 700. Stress relief structure 730 includes a first opening 731 and a second opening 732 which are respectively configured to receive the system coolant supply hose and the system coolant return hose.

Figure 8:
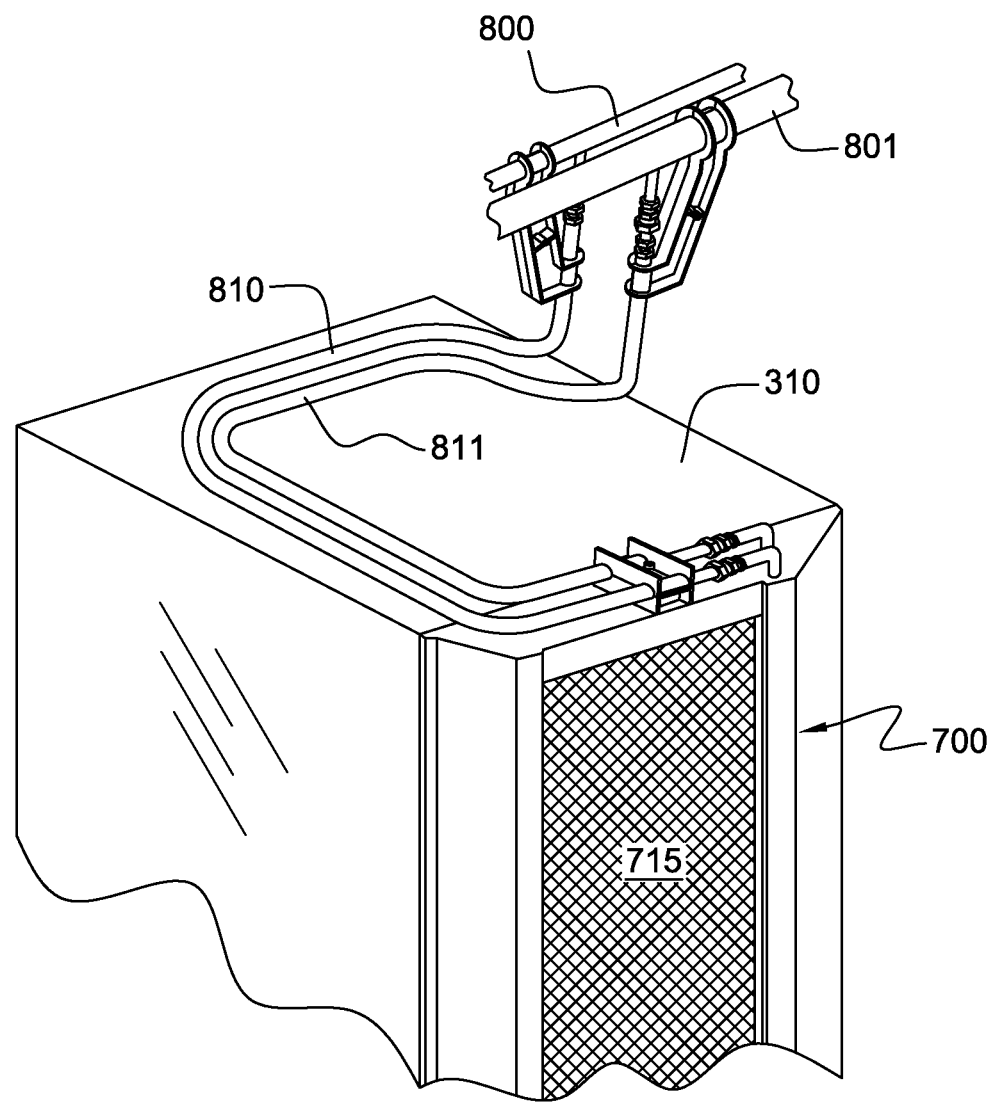
FIG. 8 is a partial isometric view of one embodiment of a single electronics rack, with a rack door and an air-to-liquid heat exchanger, and illustrating one embodiment of coolant supply and return headers of a data center, in accordance with one or more aspects of the present invention.

FIG. 8 depicts one embodiment of electronics rack 310 comprising a hinged outlet door 700 with an air-to-liquid heat exchanger 715 disposed therein, and illustrating overhead system coolant supply and return headers 800, 801, respectively. As shown, system coolant supply and return hoses 810, 811 couple the air-to-liquid heat exchanger 715 in fluid communication with the system coolant supply and return headers 800, 801, respectively. In one embodiment, system coolant supply and return hoses 810, 811 are sufficiently sized to allow for translational and rotational movement of the hoses with opening or closing of the heat exchanger door 700. If desired, retention loops could be provided for constraining movement of the hoses at multiple locations on top of the electronics rack.

Those skilled in the art will note that the door, door frame and air-to-liquid heat exchanger embodiments depicted in FIGS. 3-8 are presented by way of example only. For example, a multi-rack assembly with door-mounted heat exchanger, such as described hereinbelow, may be implemented with similar cooling structures such as those described above in connection with FIGS. 3-8, or in various alternate embodiments thereof. For instance, in one alternate embodiment, the system coolant supply and return manifolds could be disposed beneath the electronics racks in a raised floor data center. Further, the particular design of the air-to-liquid heat exchanger can vary without departing from the one or more aspects of the present invention disclosed herein.

Figure 9A:
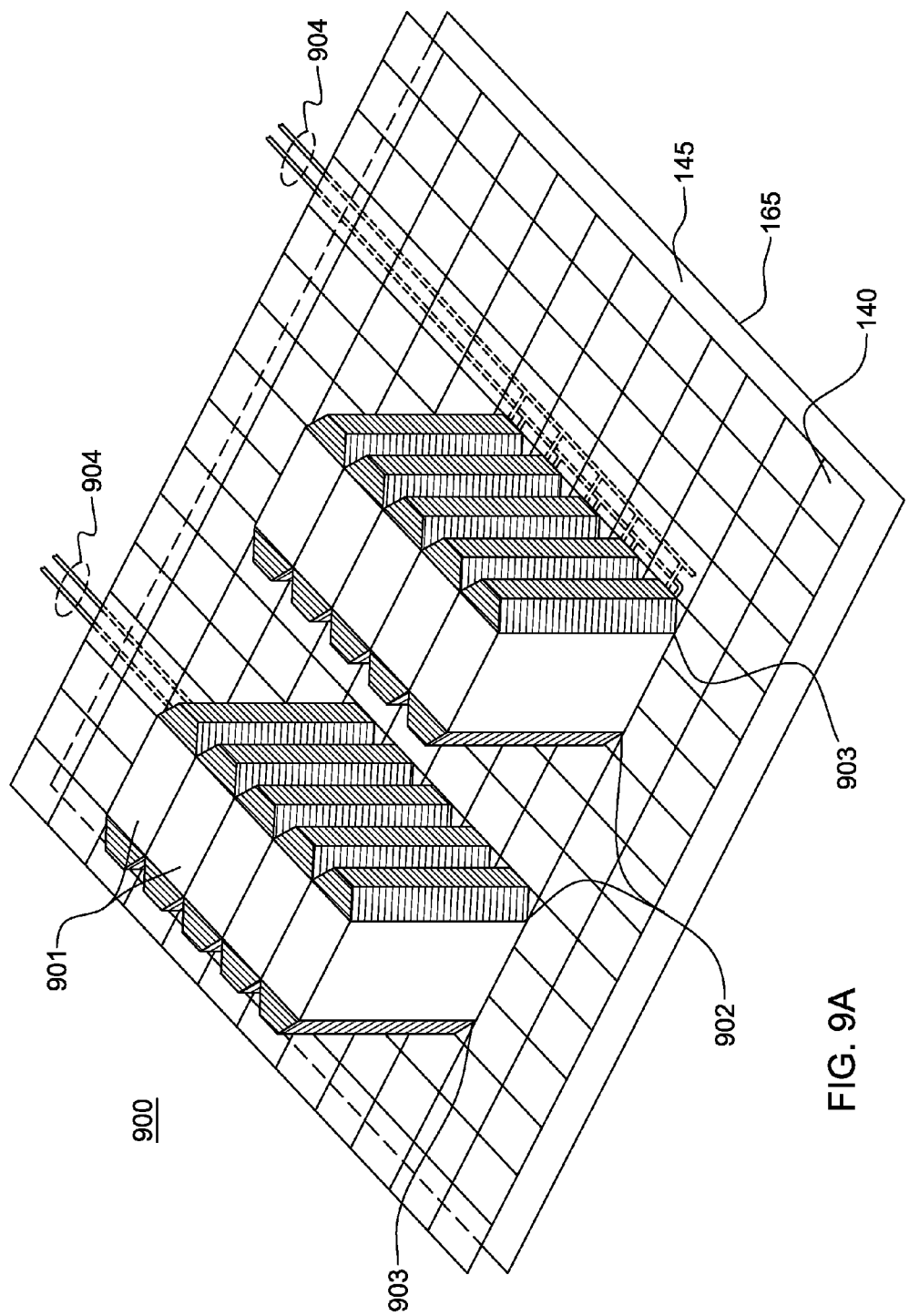
FIG. 9A depicts an alternate embodiment of a data center employing a plurality of liquid-cooled electronics racks, in accordance with one or more aspects of the present invention.

FIG. 9A depicts an alternate embodiment of a data center, generally denoted 900, comprising multiple liquid-cooled electronics racks 901 arranged in one or more rows within the data center. As with the data center embodiment of FIG. 1, the liquid-cooled electronics racks within the data center 900 of FIG. 9A may house several hundred, or even several thousand microprocessors. The electronics racks are disposed, in this embodiment, on raised floor 140, which is spaced above base or sub-floor 165 of the room, and which (in this embodiment) accommodates one or more facility coolant loops 904 providing chilled facility coolant to cooling units disposed within the liquid-cooled electronics racks 901, as explained further below with reference to FIGS. 9B-14. As also explained below, in one embodiment, liquid-cooled electronics racks 901 comprise an air inlet side 902 and an air outlet side 903, which may comprise louvered doors that allow for the ingress and egress, respectively, of external air through the electronics rack.

Figure 9B:
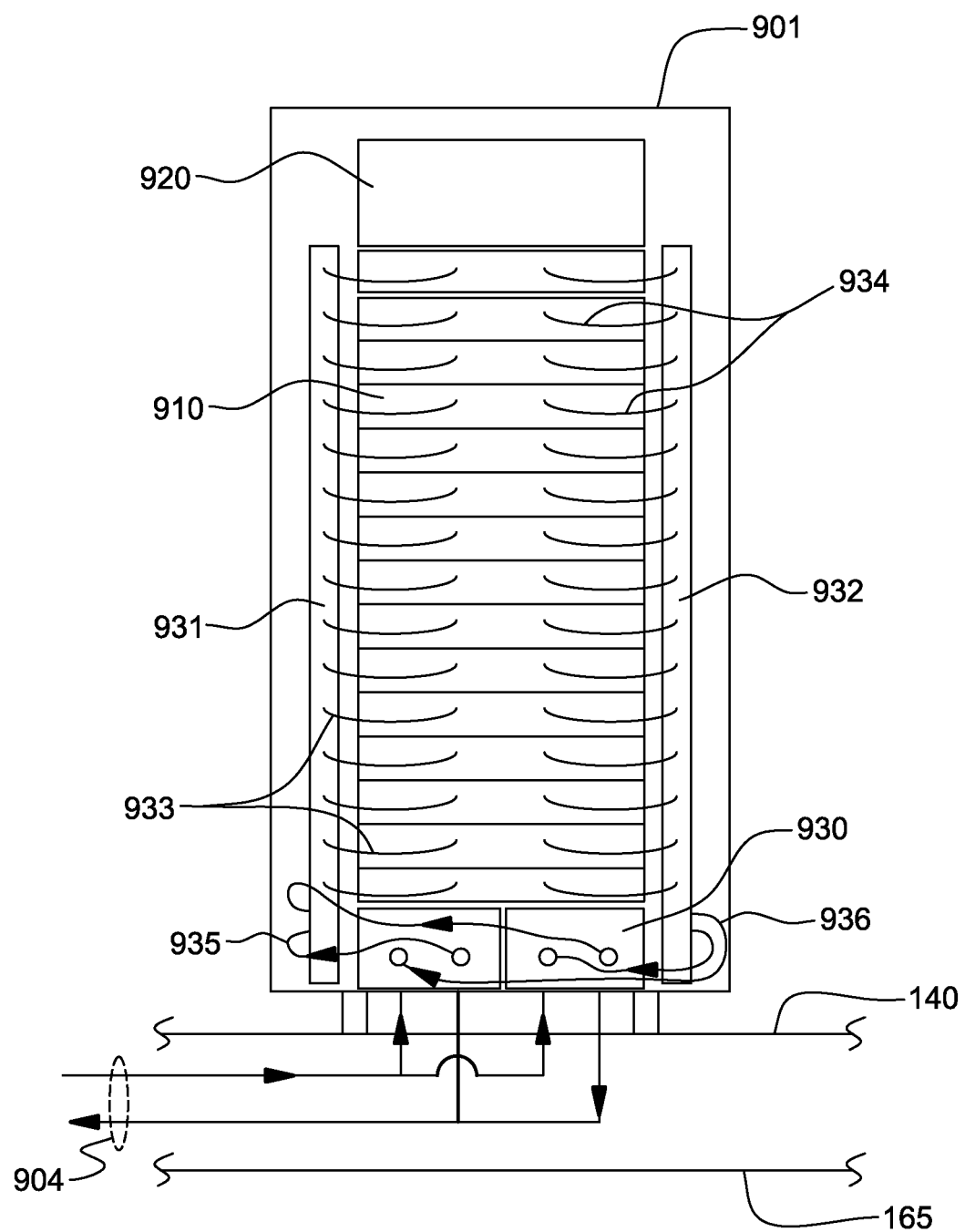
FIG. 9B is a front elevational view of one embodiment of a liquid-cooled electronics rack comprising multiple electronic subsystems cooled by a cooling apparatus, in accordance with one or more aspects of the present invention.

FIG. 9B depicts one embodiment of a liquid-cooled electronics rack 901 which employs a cooling apparatus to be monitored and operated as described herein. In one embodiment, liquid-cooled electronics rack 901 comprises a plurality of electronic subsystems 910, which comprise (in one embodiment) processor or server nodes. A bulk power regulator 920 is shown disposed at an upper portion of liquid-cooled electronics rack 901, and two modular cooling units (MCUs) 930 are disposed in a lower portion of the liquid-cooled electronics rack. In the embodiments described herein, the coolant is assumed to be water or an aqueous-based solution, again, by way of example only.

In addition to MCUs 930, the cooling apparatus includes a system water supply manifold 931, a system water return manifold 932, and manifold-to-node fluid connect hoses 933 coupling system water supply manifold 931 to electronic subsystems 910, and node-to-manifold fluid connect hoses 934 coupling the individual electronic subsystems 910 to system water return manifold 932. Each MCU 930 is in fluid communication with system water supply manifold 931 via a respective system water supply hose 935, and each MCU 930 is in fluid communication with system water return manifold 932 via a respective system water return hose 936.

As illustrated, heat load of the electronic subsystems is transferred from the system water to cooler facility water supplied by facility water supply line 940 and facility water return line 941 disposed, in the illustrated embodiment, in the space between a raised floor 140 and a base floor 165.

Figure 10:
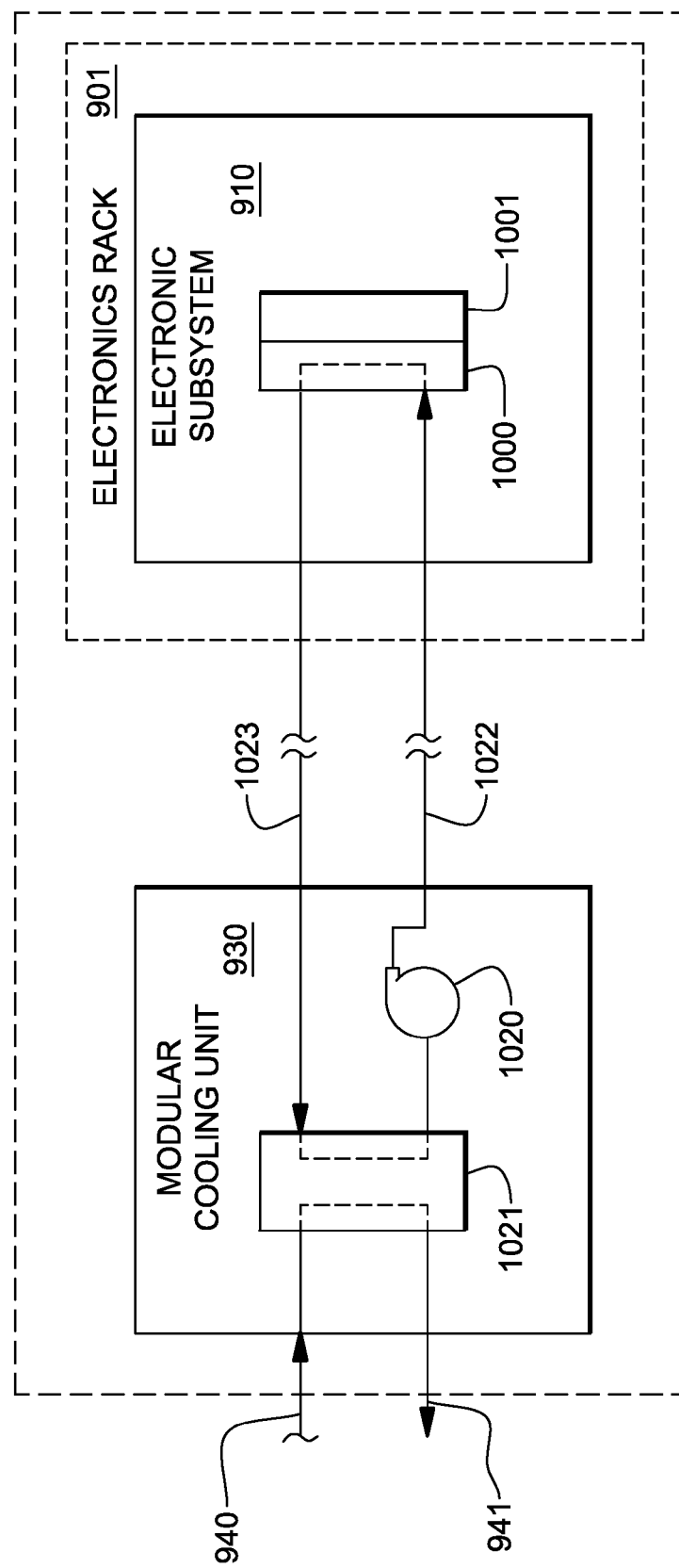
FIG. 10 is a schematic of one embodiment of an electronic subsystem of a liquid-cooled electronics rack, wherein an electronic module is liquid-cooled by system coolant provided by one or more modular cooling units disposed within the electronics rack, in accordance with one or more aspects of the present invention.

FIG. 10 schematically illustrates operation of the cooling apparatus of FIG. 9B, wherein a liquid-cooled cold plate 1000 is shown coupled to an electronic module 1001 of an electronic subsystem 910 within the liquid-cooled electronics rack 901. Heat is removed from electronic module 1001 via the system coolant circulated via pump 1020 through cold plate 1000 within the system coolant loop defined by liquid-to-liquid heat exchanger 1021 of modular cooling unit 930, lines 1022, 1023 and cold plate 1000. The system coolant loop and modular cooling unit 930 are designed to provide coolant of a controlled temperature and pressure, as well as controlled chemistry and cleanliness to cool the electronic module(s). Furthermore, the system coolant is physically separate from the less controlled facility coolant in lines 940, 941, to which heat is ultimately transferred.

Figure 11:
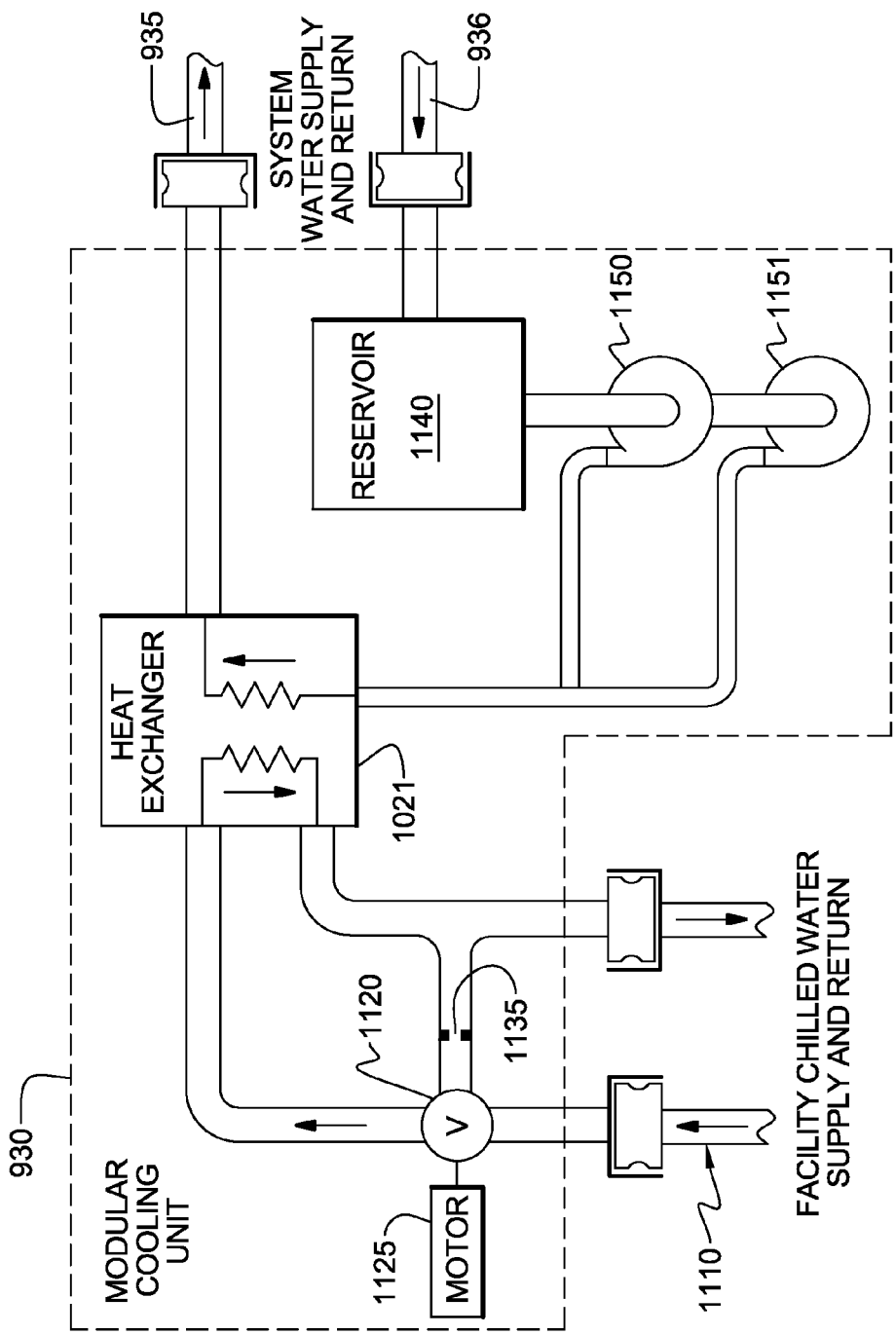
FIG. 11 is a schematic of one embodiment of a modular cooling unit for a liquid-cooled electronics rack, in accordance with one or more aspects of the present invention.

FIG. 11 depicts a more detailed embodiment of a modular cooling unit 930, in accordance with an aspect of the present invention. As shown in FIG. 11, modular cooling unit 930 includes a first cooling loop wherein building chilled, facility coolant is supplied 1110 and passes through a control valve 1120 driven by a motor 1125. Valve 1120 determines an amount of facility coolant to be passed through heat exchanger 1021, with a portion of the facility coolant possibly being returned directly via a bypass orifice 1135. The modular water cooling unit further includes a second cooling loop with a reservoir tank 1140 from which system coolant is pumped, either by pump 1150 or pump 1151, into the heat exchanger 1021 for conditioning and output thereof, as cooled system coolant to the electronics rack to be cooled. The cooled system coolant is supplied to the system water supply manifold and system water return manifold of the liquid-cooled electronics rack via the system water supply hose 935 and system water return hose 936, respectively.

Figure 12:
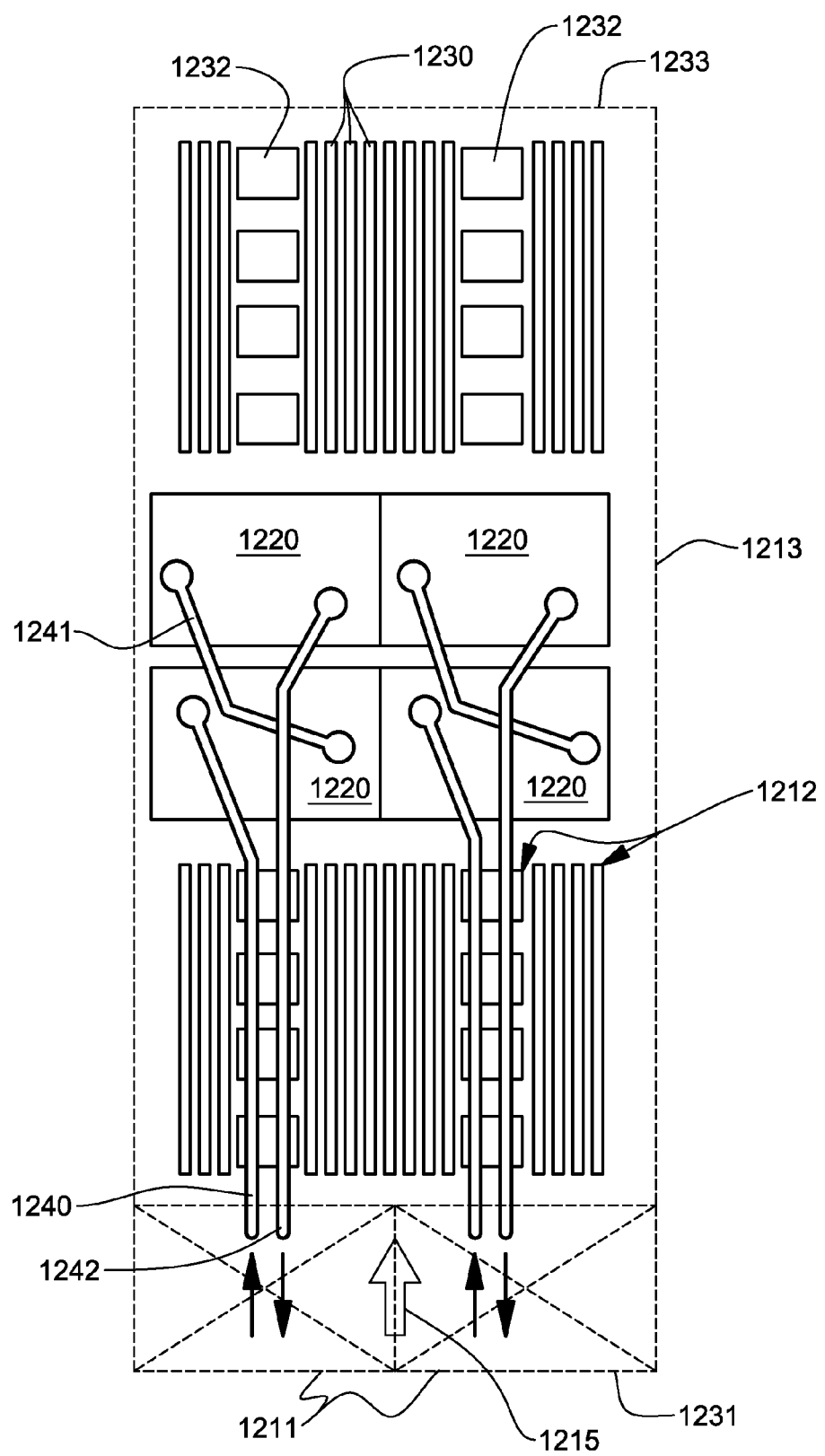
FIG. 12 is a plan view of one embodiment of an electronic subsystem layout illustrating an air and liquid-cooling subsystem for cooling components of an electronic subsystem of a liquid-cooled electronics rack, in accordance with one or more aspects of the present invention.

FIG. 12 depicts one embodiment of an electronic subsystem 1213 component layout wherein one or more air moving devices 1211 provide forced air flow 1215 to cool multiple components 1212 within electronic subsystem 1213. Cool air is taken in through a front 1231 and exhausted out a back 1233 of the drawer. The multiple components to be cooled include multiple processor modules to which liquid-cooled cold plates 1220 (of a liquid-based cooling system) are coupled, as well as multiple arrays of memory modules 1230 (e.g., dual in-line memory modules (DIMMs)) and multiple rows of memory support modules 1232 (e.g., DIMM control modules) to which air-cooled heat sinks are coupled. In the embodiment illustrated, memory modules 1230 and the memory support modules 1232 are partially arrayed near front 1231 of electronic subsystem 910, and partially arrayed near back 1233 of electronic subsystem 910. Also, in the embodiment of FIG. 12, memory modules 1230 and the memory support modules 1232 are cooled by air flow 1215 across the electronic subsystem.

The illustrated liquid-based cooling system further includes multiple coolant-carrying tubes connected to and in fluid communication with liquid-cooled cold plates 1220. The coolant-carrying tubes comprise sets of coolant-carrying tubes, with each set including (for example) a coolant supply tube 1240, a bridge tube 1241 and a coolant return tube 1242. In this example, each set of tubes provides liquid coolant to a series-connected pair of cold plates 1220 (coupled to a pair of processor modules). Coolant flows into a first cold plate of each pair via the coolant supply tube 1240 and from the first cold plate to a second cold plate of the pair via bridge tube or line 1241, which may or may not be thermally conductive. From the second cold plate of the pair, coolant is returned through the respective coolant return tube 1242.

Figure 13:
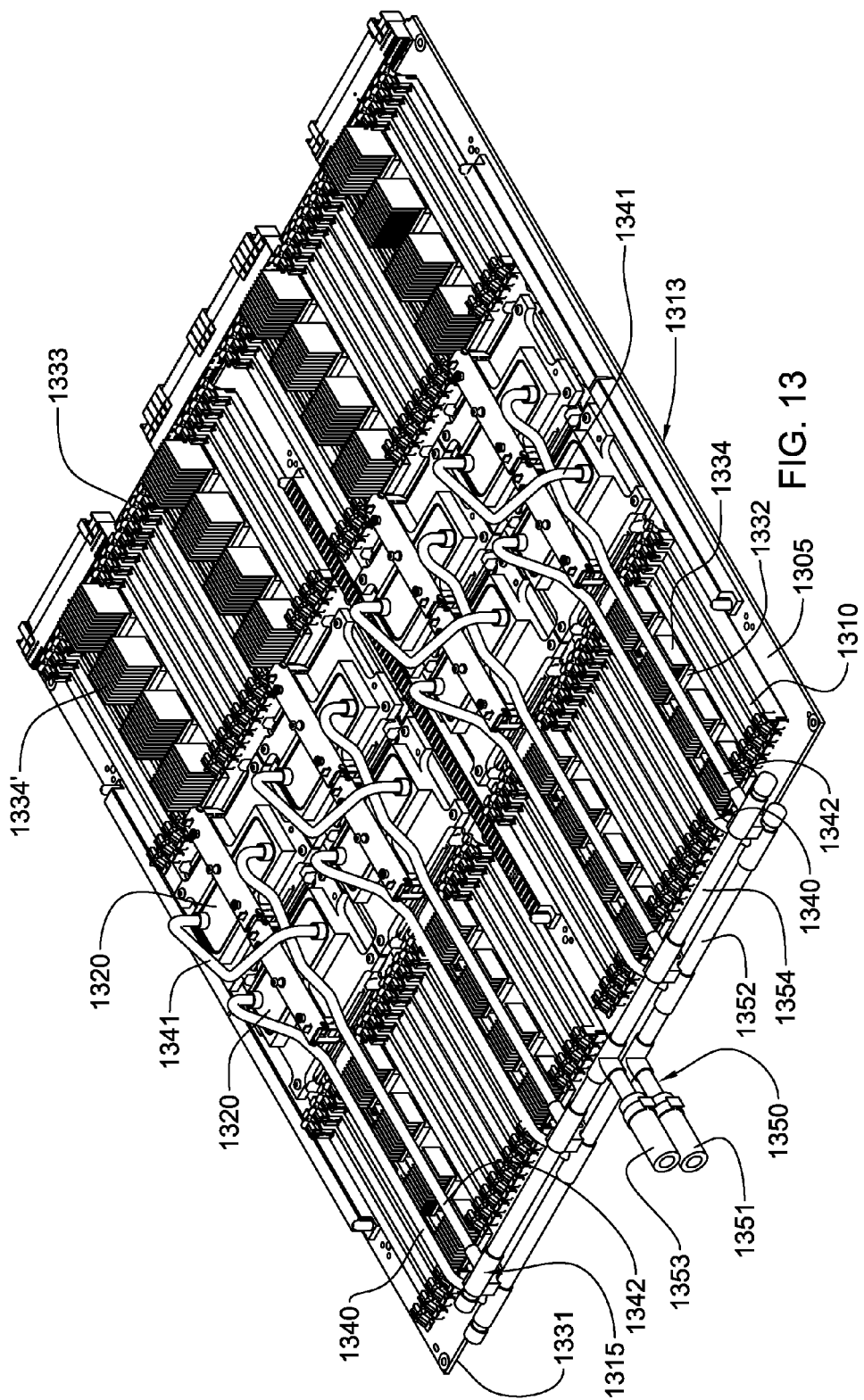
FIG. 13 depicts one detailed embodiment of a partially assembled electronic subsystem layout, wherein the electronic subsystem includes eight high-heat-generating electronic components to be cooled, each having a respective liquid-cooled structure of a liquid-based cooling system coupled thereto, in accordance with one or more aspects of the present invention.

FIG. 13 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications and need for reliability.

Thus, presented herein in one aspect (and by way of example only) is a robust and reliable liquid-based cooling system specially preconfigured and prefabricated as a monolithic structure for positioning within a particular electronics drawer.

FIG. 13 is an isometric view of one embodiment of an electronic drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 13 depicts a partially assembled electronic system 1313 and an assembled liquid-based cooling system 1315 coupled to primary heat generating components (e.g., including processor dies) to be cooled. In this embodiment, the electronic system is configured for (or as) an electronic drawer or subsystem of an electronics rack, and includes, by way of example, a support substrate or planar board 1305, a plurality of memory module sockets 1310 (with the memory modules (e.g., dual in-line memory modules) not shown), multiple rows of memory support modules 1332 (each having coupled thereto an air-cooled heat sink 1334), and multiple processor modules (not shown) disposed below the liquid-cooled cold plates 1320 of the liquid-based cooling system 1315.

In addition to liquid-cooled cold plates 1320, liquid-based cooling system 1315 includes multiple coolant-carrying tubes, including coolant supply tubes 1340 and coolant return tubes 1342 in fluid communication with respective liquid-cooled cold plates 1320. The coolant-carrying tubes 1340, 1342 are also connected to a header (or manifold) subassembly 1350 which facilitates distribution of liquid coolant to the coolant supply tubes and return of liquid coolant from the coolant return tubes 1342. In this embodiment, the air-cooled heat sinks 1334 coupled to memory support modules 1332 closer to front 1331 of electronic drawer 1313 are shorter in height than the air-cooled heat sinks 1334' coupled to memory support modules 1332 near back 1333 of electronics drawer 1313. This size difference is to accommodate the coolant-carrying tubes 1340, 1342 since, in this embodiment, the header subassembly 1350 is at the front 1331 of the electronic drawer and the multiple liquid-cooled cold plates 1320 are in the middle of the drawer.

Liquid-based cooling system 1315 comprises (in this embodiment) a preconfigured monolithic structure which includes multiple (pre-assembled) liquid-cooled cold plates 1320 configured and disposed in spaced relation to engage respective heat generating electronic components. Each liquid-cooled cold plate 1320 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 1320 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 13, header subassembly 1350 includes two liquid manifolds, i.e., a coolant supply header 1352 and a coolant return header 1354, which in one embodiment, are coupled together via supporting brackets. In the monolithic cooling structure of FIG. 13, the coolant supply header 1352 is metallurgically bonded and in fluid communication to each coolant supply tube 1340, while the coolant return header 1354 is metallurgically bonded and in fluid communication to each coolant return tube 1342. A single coolant inlet 1351 and a single coolant outlet 1353 extend from the header subassembly for coupling to the electronics rack's coolant supply and return manifolds (not shown).

FIG. 13 also depicts one embodiment of the preconfigured, coolant-carrying tubes. In addition to coolant supply tubes 1340 and coolant return tubes 1342, bridge tubes or lines 1341 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 1340, bridge tubes 1341 and coolant return tubes 1342 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronic system to facilitate installation of the monolithic structure in engaging relation with the electronic system.

Liquid cooling of heat-generating electronic components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described herein may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate an air-to-liquid heat exchanger, for example, at the air outlet side of the electronics rack, to extract heat from air egressing from the electronics rack. This solution is presented in combination with liquid-cooled cold plate cooling of certain primary heat-generating components within the electronics rack. To provide the necessary amount of coolant, two MCUs are (in one embodiment) associated with the electronics rack, and system coolant is fed from each MCU to the air-to-liquid heat exchanger in parallel to the flow of system coolant to the liquid-cooled cold plates disposed within the one or more electronic subsystems of the electronics rack.

Also, for a high availability system, techniques may be provided for maintaining operation of one modular cooling unit, notwithstanding failure of another modular cooling unit of an electronics rack. This allows continued provision of system coolant to the one or more electronic subsystems of the rack being liquid-cooled. To facilitate liquid cooling of the primary heat-generating electronics components within the electronics rack, one or more isolation valves may be employed, in one embodiment upon detection of failure at one MCU of the two MCUs, to shut off coolant flow to the air-to-liquid heat exchanger, and thereby, conserve coolant for the direct cooling of the electronic subsystems.

Figure 14:
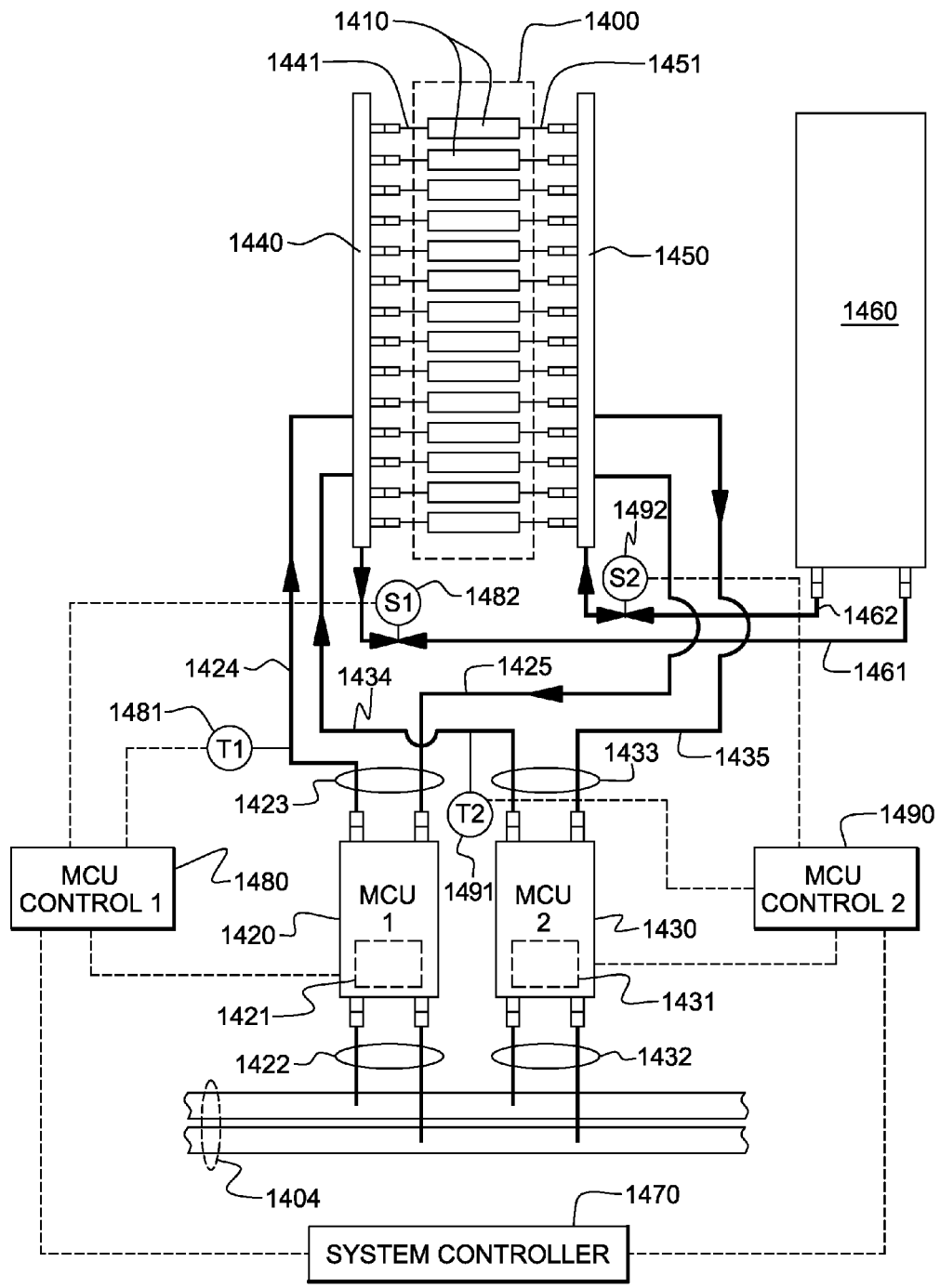
FIG. 14 is a schematic of one embodiment of a cooled electronic system comprising a liquid-cooled electronics rack and a cooling apparatus associated therewith, wherein the cooling apparatus includes two modular cooling units (MCUs) for providing system coolant to the electronic subsystems of the electronics rack, and to an air-to-liquid heat exchanger disposed (for example) at an air outlet side of the electronics rack, for cooling air egressing therefrom, in accordance with one or more aspects of the present invention.

FIG. 14 illustrates one embodiment of a liquid-cooled electronics rack 1400, which includes a plurality of heat-generating electronic subsystems 1410, which are liquid-cooled employing a cooling apparatus comprising at least two modular cooling units (MCUs) 1420, 1430 labeled MCU 1 & MCU 2, respectively. The MCUs are configured and coupled to provide system coolant in parallel to the plurality of heat-generating electronic subsystems for facilitating liquid cooling thereof. Each MCU 1420, 1430 includes a liquid-to-liquid heat exchanger 1421, 1431, coupled to a first coolant loop 1422, 1432, and to a second coolant loop, 1423, 1433, respectively. The first coolant loops 1422, 1432 are coupled to receive chilled coolant, such as facility coolant, via (for example) facility coolant supply line and facility coolant return line of facility coolant loop 1404. Each first coolant loop 1422, 1432 passes at least a portion of the chilled coolant flowing therein through the respective liquid-to-liquid heat exchanger 1421, 1431. Each second coolant loop 1423, 1433 provides cooled system coolant to the plurality of heat-generating electronic subsystems 1410 of electronics rack 1400, and expels heat via the respective liquid-to-liquid heat exchanger 1421, 1431 from the plurality of heat-generating electronic subsystems 1410 to the chilled coolant in the first coolant loop 1422, 1432.

The second coolant loops 1423, 1433 include respective coolant supply lines 1424, 1434, which supply cooled system coolant from the liquid-to-liquid heat exchangers 1421, 1431 to a system coolant supply manifold 1440. System coolant supply manifold 1440 is coupled via flexible supply hoses 1441 to the plurality of heat-generating electronic subsystems 1410 of electronics rack 1400 (e.g., using quick connect couplings connected to respective ports of the system coolant supply manifold). Similarly, second coolant loops 1423, 1433 include system coolant return lines 1425, 1435 coupling a system coolant return manifold 1450 to the respective liquid-to-liquid heat exchangers 1421, 1431. System coolant is exhausted from the plurality of heat-generating electronic subsystems 1410 via flexible return hoses 1451 coupling the heat-generating electronic subsystems to system coolant return manifold 1450. In one embodiment, the return hoses may couple to respective ports of the system coolant return manifold via quick connect couplings. Further, in one embodiment, the plurality of heat-generating electronic subsystems each include a respective liquid-based cooling subsystem, such as described above in connection with FIGS. 9B-13, coupled to flexible supply hoses 1441 and flexible return hoses 1451 to facilitate liquid cooling of one or more heat-generating electronic components disposed within the electronic subsystem.

In addition to supplying and exhausting system coolant in parallel to the plurality of heat-generating electronic subsystems of the electronics rack, the MCUs 1420, 1430 also provide in parallel system coolant to an air-to-liquid heat exchanger 1460 disposed, for example, for cooling air passing through the electronics rack from an air inlet side to an air outlet side thereof. By way of example, air-to-liquid heat exchanger 1460 is a rear door heat exchanger disposed at the air outlet side of electronics rack 1400. Further, in one example, air-to-liquid heat exchanger 1460 is sized to cool substantially all air egressing from electronics rack 1400, and thereby reduce air-conditioning requirements for a data center containing the electronics rack. In one example, a plurality of electronics racks in the data center of FIG. 9A may each be provided with a cooling apparatus such as described herein and depicted in FIG. 14.

In the embodiment of FIG. 14, system coolant flows to and from air-to-liquid heat exchanger 1460 via a coolant supply line 1461 coupling system coolant supply manifold 1440 to air-to-liquid heat exchanger 1460, and a coolant return line 1462 coupling the air-to-liquid heat exchanger to system coolant return manifold 1450. Quick connect couplings may be employed at the inlet and outlet of air-to-liquid heat exchanger 1460 and/or at corresponding ports at the system coolant supply and return manifolds to facilitate connection of coolant supply and return lines 1461, 1462. In one embodiment, it is assumed that one MCU of the two MCUs illustrated is incapable of being sized to function within required design parameters as a primary MCU (with the other MCU being a backup MCU) to extract the full heat load from both the plurality of heat-generating electronic subsystems and the air-to-liquid heat exchanger. Therefore, the two MCUs 1420, 1430 are assumed in normal operation to be functioning in parallel. This also ensures a measure of redundancy to the cooling system.

As shown, the cooling system further includes a system controller 1470, and an MCU control 1 1480 and an MCU control 2 1490, which cooperate together to monitor system coolant temperature of each MCU, and automatically isolate air-to-liquid heat exchanger 1460 upon detection of failure of one MCU (as well as to ensure shut down of a failing MCU) so as not to degrade cooling capability of the system coolant provided by the remaining operational MCU to the electronics subsystems of the rack. In one embodiment, the MCU control 1 and the MCU control 2 are control cards, each associated with a respective MCU.

As shown, system controller 1470 is coupled to both MCU control 1 and the MCU control 2. MCU control 1 1480 is coupled to a temperature sensor T1 1481, which is disposed to sense system coolant temperature within system coolant supply line 1424, for example, near a coolant outlet of liquid-to-liquid heat exchanger 1421 within MCU 1 1420. Additionally, MCU control 1 1480 is coupled to a solenoid-actuated isolation valve S1 1482, which in the embodiment depicted, is disposed within coolant supply line 1461 coupling in fluid communication system coolant supply manifold 1440 to air-to-liquid heat exchanger 1460. Similarly, MCU control 2 1490 couples to MCU 2 1430, as well as to a second temperature sensor T2 1491, disposed for sensing system coolant temperature within system coolant supply line 1434, and to a second isolation valve S2 1492, which in the example depicted, is coupled to coolant return line 1462 coupling air-to-liquid heat exchanger 1460 to system coolant return manifold 1450.

Also note that in the example of FIG. 14, the MCUs operate to transfer heat extracted by the circulating system coolant to the facility chilled coolant. Note also that system coolant flow to the electronic subsystems and the air-to-liquid heat exchanger is in parallel. This flow arrangement advantageously provides a lowest temperature coolant to all of the cooling components in the system. This in turn translates into lowest possible electronic component temperatures within the electronic subsystems, as well as a maximum amount of heat removal from air flowing through the electronics rack by the air-to-liquid heat exchanger, for example, to allow a substantial amount of the heat to be removed prior to returning the air to the computer room environment.

Figure 15:
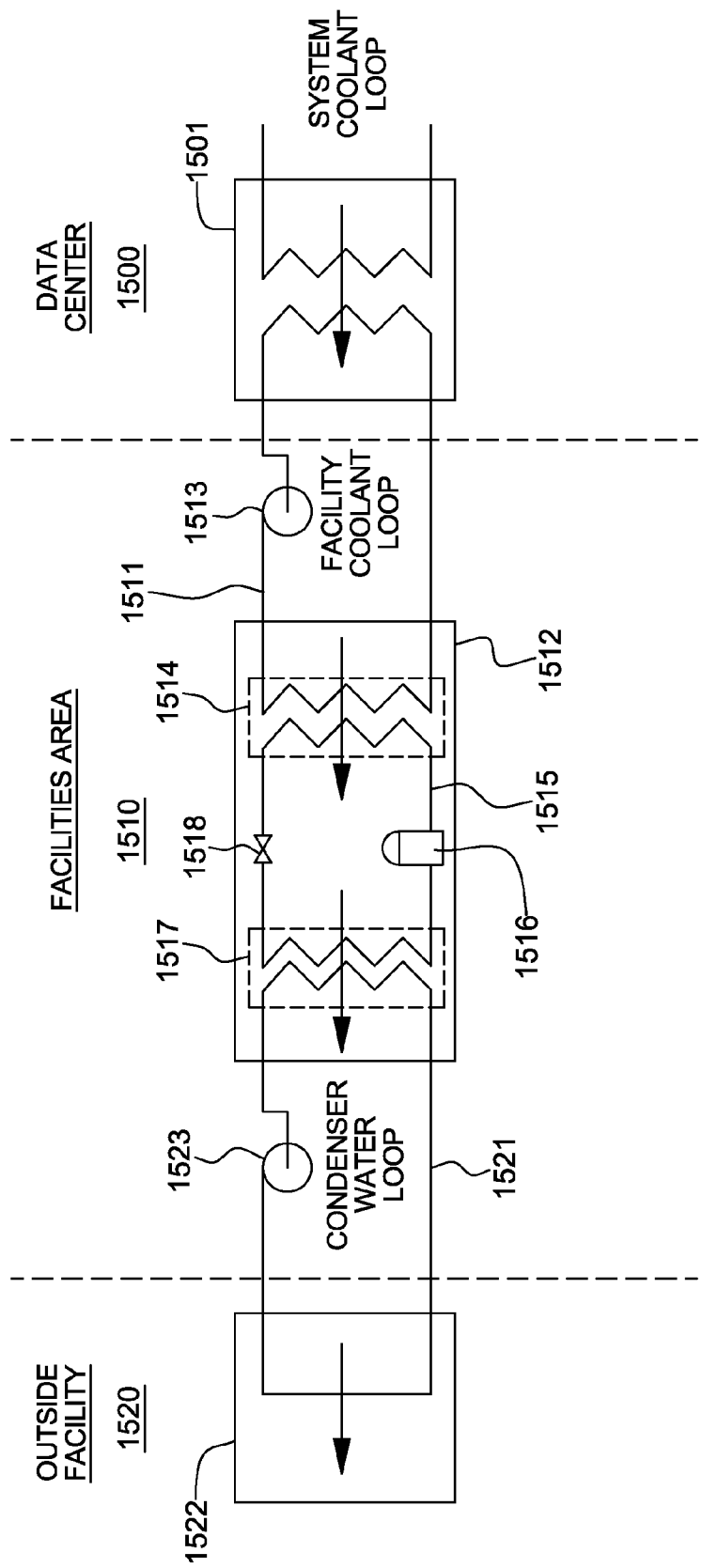
FIG. 15 is a schematic of one embodiment of heat transfer from one or more modular cooling units disposed within one or more electronics racks of a data center to a cooling tower disposed outside of the data center, in accordance with one or more aspects of the present invention.

FIG. 15 is a high-level illustration of one embodiment of heat transfer through a data center cooling system comprising liquid-cooled electronics racks such as described herein. In this embodiment, heat is transferred from one or more electronics racks within a data center 1500 to a facilities area 1510, and ultimately to an area 1520 outside of the facilities area and the data center. Specifically, one or more cooling units, such as modular cooling units (MCUs) 1501, each comprise a liquid-to-liquid heat exchanger for facilitating transfer of heat from system coolant flowing through the associated liquid-cooled electronics rack to a facility coolant loop 1511 disposed (in this embodiment) to transfer heat between MCU 1501 and a refrigeration chiller 1512. A coolant pump 1513 pumps facility coolant through facility coolant loop 1511 to facilitate transfer of heat from the liquid-to-liquid heat exchanger within MCU 1501 to an evaporator 1514 within refrigeration chiller 1512. Evaporator 1514 extracts heat from facility coolant flowing through facility coolant loop 1511 and transfers the heat to a refrigerant flowing through a refrigerant loop 1515. Refrigerant loop 1515 couples in fluid communication evaporator 1514, a compressor 1516, a condenser 1517 and an expansion valve 1518. Refrigeration chiller 1512 implements, in one embodiment, a conventional vapor-compression refrigeration cycle. Condenser 1517 dissipates heat to, for example, a condenser water loop 1521 disposed between refrigeration chiller 1512 and a cooling tower 1522 positioned, for example, outside 1520 facility area 1510 and data center 1500. Heated water is evaporatively cooled within cooling tower 1522 and the cooled water is circulated via a water pump 1523 through condenser 1517 of refrigeration chiller 1512.

Thus, the overall cooling system transfers heat from the IT equipment, i.e., the electronics rack, to the outdoor ambient air. Moving in the direction of heat flow, heat generated within the electronics rack is transferred to the facility coolant loop via the modular cooling unit(s). The facility coolant loop carries the heat to a refrigeration chiller, with the heat being taken into the refrigeration chiller at its evaporator and rejected to a condenser water loop at its condenser. The condenser water passes outside of the facility to, for example, one or more cooling towers that transfer the heat to the outside ambient air.

Figure 16:
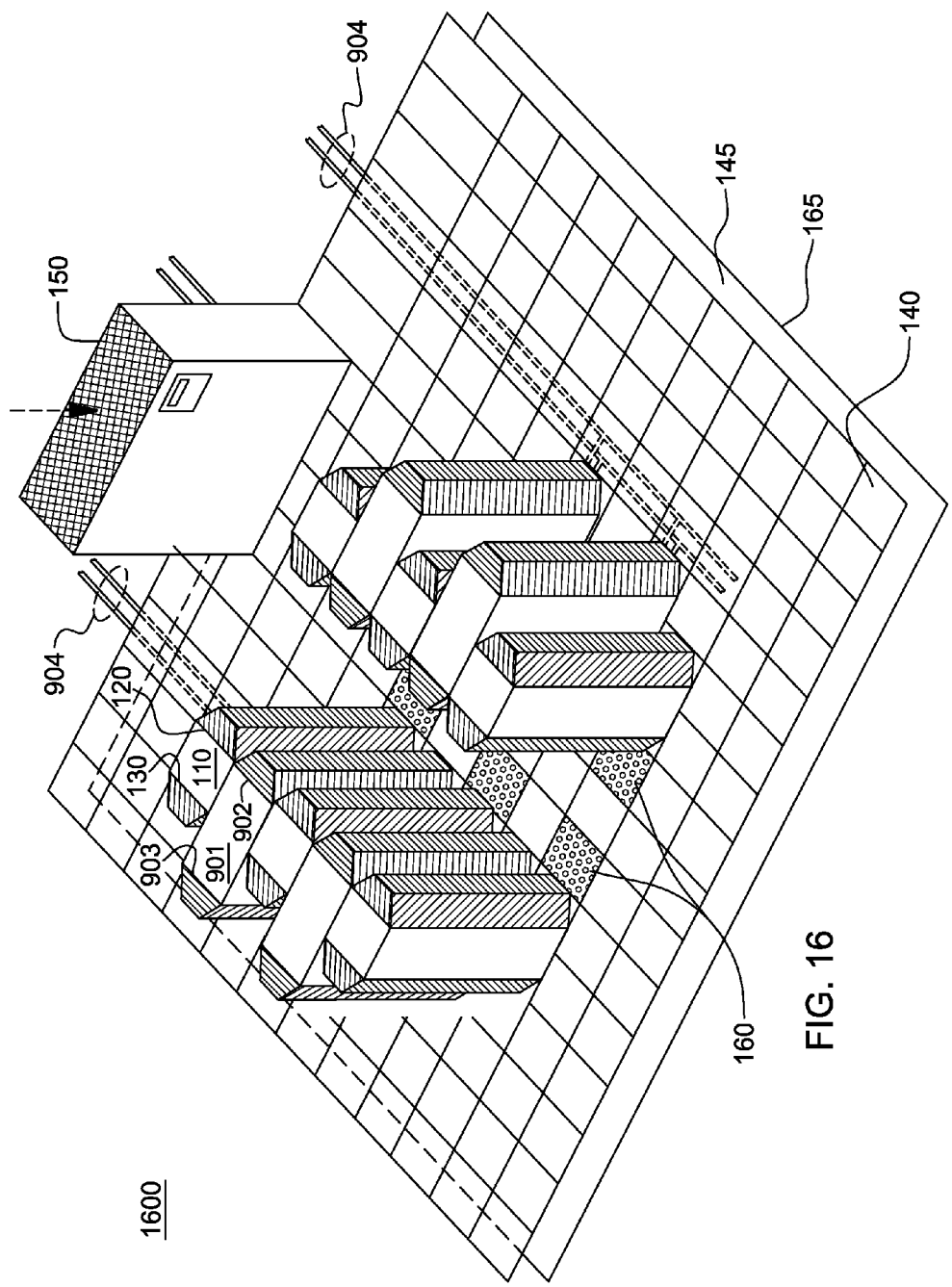
FIG. 16 depicts an alternate embodiment of a heterogeneous data center comprising a plurality of liquid-cooled electronics racks, and a plurality of air-cooled electronics racks, in accordance with one or more aspects of the present invention.

FIG. 16 depicts another embodiment of a data center, generally denoted 1600, in accordance with one or more aspects of the present invention. By way of example, data center 1600 comprises one embodiment of a heterogeneous data center with a plurality of liquid-cooled electronics racks 901, and a plurality of air-cooled electronics racks 110, shown interspersed in rows of data center 1600. Liquid-cooled electronics racks 901 comprise air inlet sides 902 and air outlet sides 903, and air-cooled electronics racks 110 include air inlet sides 120 and air outlet sides 130, with the respective air inlet sides 902, 120 of the liquid-cooled electronics racks 901 and air-cooled electronics racks 110 disposed in a row being aligned to form a cold air aisle of data center 1600. Supply air plenum 145 provides conditioned and cooled air to the air inlet sides of the electronics racks through perforated floor tiles 160 disposed in the cold air aisle of the data center. The supply air plenum 145 is defined between raised floor 140 and base (or sub-floor) 165 of the room, and the conditioned and cooled air is supplied to plenum 145 by one or more air-conditioning units 150, also disposed within data center 1600. Room air is taken into each air-conditioning unit 150 near an upper portion thereof. This room air comprises (in part) exhausted air from the "hot" air aisles of the data center defined at least partially by, for example, the air outlet sides 903, 130 of liquid-cooled electronics racks 901 and air-cooled electronics racks 110. As explained above, liquid-cooled electronics racks 901 each include a cooling apparatus which comprises one or more cooling units, each comprising a liquid-to-liquid heat exchanger coupled in fluid communication to receive chilled facility coolant via a respective facility coolant loop 904. The one or more facility coolant loops may be coupled to a facility chiller unit (not shown) of the data center 1600.

One drawback to the data center configuration illustrated in FIG. 16 is the capital cost and energy use required in including air-conditioning unit(s) 150 within the data center to handle the air cooling requirements of the air-cooled electronics racks 110. FIGS. 17A-18B depict an alternate data center embodiment which addresses this drawback by providing multi-rack assemblies, wherein a first, liquid-cooled electronics rack with unused cooling capacity provides cooled coolant to a second electronics rack to facilitate extracting heat generated within the second electronics rack.

By way of example, a multi-rack assembly in accordance with the embodiment of FIGS. 17A-18B includes a first electronics rack, a second electronics rack, and a controller. The first electronics rack is a liquid-cooled electronics rack and includes at least one first rack electronic component to be cooled, as well as one or more cooling units disposed within the first electronics rack and coupled in fluid communication with a primary coolant loop of the first electronics rack to, at least in part, facilitate cooling the at least one first rack electronic component. The cooling unit(s) provides cooled coolant to the primary coolant loop, which in one embodiment, is coupled to a first heat exchange assembly, such as one or more liquid-cooled cold plates coupled to the at least one first rack electronic component to be cooled. The second electronics rack includes a secondary coolant loop which is coupled in fluid communication with the cooling unit(s) disposed within the first electronics rack. The cooling unit(s) disposed within the first electronics rack controllably provide cooled coolant to the secondary coolant loop to facilitate extracting heat generated within the second electronics rack. The controller automatically controls flow of cooled coolant from the cooling unit(s) in the first electronics rack to the secondary coolant loop of the second electronics rack depending, at least in part, on cooling requirements of the first electronics rack.

More particularly, in accordance with one or more aspects of the present invention, priority is given to cooling the first, liquid-cooled electronics rack. Provided that, for example, a temperature associated with the at least one first rack electronic component of the first electronics rack remains within a specified operating range, excess cooling capacity of the cooling unit(s) disposed within the first electronics rack is employed to extract heat generated within the second electronics rack by automatically providing cooled coolant to the secondary coolant loop of the second electronics rack. Excess capacity of the cooling unit within the first electronics rack might exist, for example, by design; that is, by over-sizing the cooling unit capacity above that required to cool the first electronics rack. Alternatively, excess cooling capacity might exist in a liquid-cooled electronics rack which is not fully populated with the maximum number of electronic subsystems or servers for which the liquid-cooled electronics rack is designed. For example, a 30 or 42-server node electronics rack may have less than that number of server nodes within the rack in a current configuration. In such a case, excess cooling capacity exists within the cooling unit designed for that liquid-cooled electronics rack, and this excess cooling capacity can be employed to provide cooled coolant to the secondary coolant loop of a second electronics rack.

As explained further below, the cooling apparatus and multi-rack assembly of this embodiment includes one or more first heat exchange assemblies within the first electronics rack and one or more second heat exchange assemblies within the second electronics rack. In one embodiment, the one or more first heat exchange assemblies comprise one or more liquid-cooled cold plates coupled via the primary coolant loop to the cooling unit(s) disposed within the first electronics rack. The second heat exchange assembly or assemblies may comprise, for example, an air-to-liquid heat exchanger disposed at the air outlet side of the second electronics rack for cooling air egressing from the second electronics rack (and potentially at least partially recirculating from the air outlet side to the air inlet side of the second electronics rack), and/or one or more liquid-cooled cold plates coupled to one or more second rack electronic components disposed within the second electronics rack to be cooled.

The controller automatically controls flow of cooled coolant through the secondary coolant loop via, in one embodiment, a three-way diverter valve coupled between a liquid-to-liquid heat exchanger of the cooling unit(s) and the primary coolant loop and secondary coolant loop. In one embodiment, the controller controls flow of cooled coolant from the cooling unit(s) in the first electronics rack to the secondary coolant loop of the second electronics rack so that a temperature associated with the at least one first rack electronic component to be cooled remains within a specified operating range, thereby giving priority to extracting heat generated within the first electronics rack. Further, for a specified diverter valve setting, the controller may automatically adjust speed of a coolant pump of the coolant unit to dynamically adjust flow of system coolant through the primary coolant loop and the secondary coolant loop to facilitate maintaining temperature of the one or more first rack electronic components within the specified operating range. In one embodiment, the controller further automatically controls temperature of cooled coolant within the primary coolant loop and the secondary coolant loop by controlling flow of chilled facility coolant through the liquid-to-liquid heat exchanger of the cooling unit(s). For example, based on a sensed temperature of system coolant flowing to the primary coolant loop or the secondary coolant loop, the controller may automatically adjust flow of chilled facility coolant through the liquid-to-liquid heat exchanger to provide increased or decreased cooling of the system coolant flowing through the liquid-to-liquid heat exchanger.

Figure 17A:
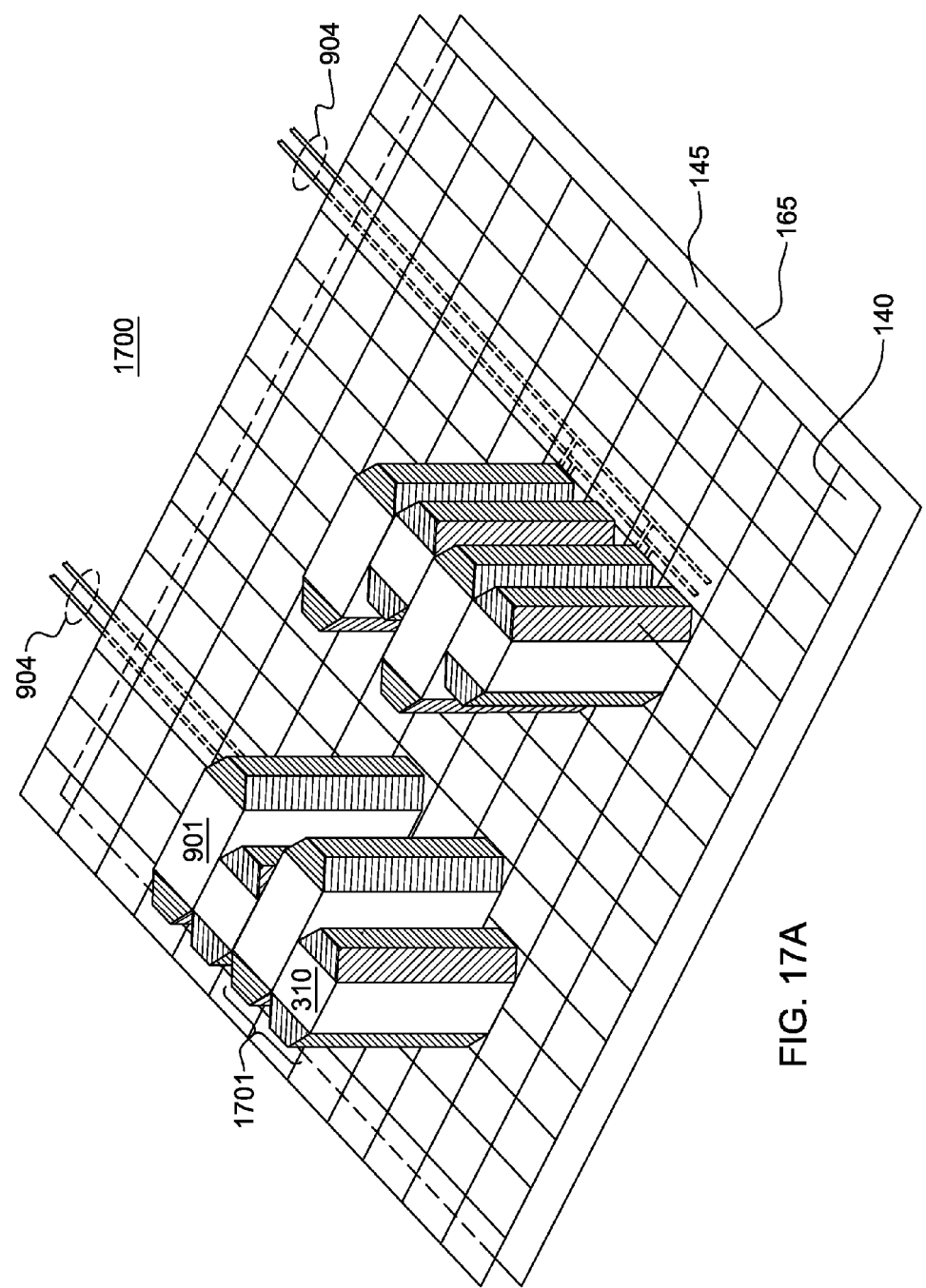
FIG. 17A depicts another embodiment of a heterogeneous data center comprising a plurality of multi-rack assemblies, in accordance with one or more aspects of the present invention.

FIG. 17A depicts one embodiment of a data center 1700 comprising a plurality of multi-rack assemblies 1701, in accordance with one or more aspects of the present invention. As used herein, "multi-rack assemblies" refers to an assembly comprising multiple electronics racks, at least one of which comprises a first, liquid-cooled electronics rack 901, and at least one second electronics rack, which in the embodiment depicted in FIG. 17A is an air-cooled electronics rack 310. In one implementation, the first electronics rack and second electronics rack may be disposed adjacent to each other, and coupled such that the secondary coolant loop of the second electronics rack is in fluid communication with the one or more cooling units disposed within the first, liquid-cooled electronics rack. In the embodiment illustrated in FIG. 17A, each multi-rack assembly 1701 comprises a single, first, liquid-cooled electronics rack 901 providing excess cooling capacity to a single, second electronics rack, such as an air-cooled electronics rack 310.

Figure 17C:
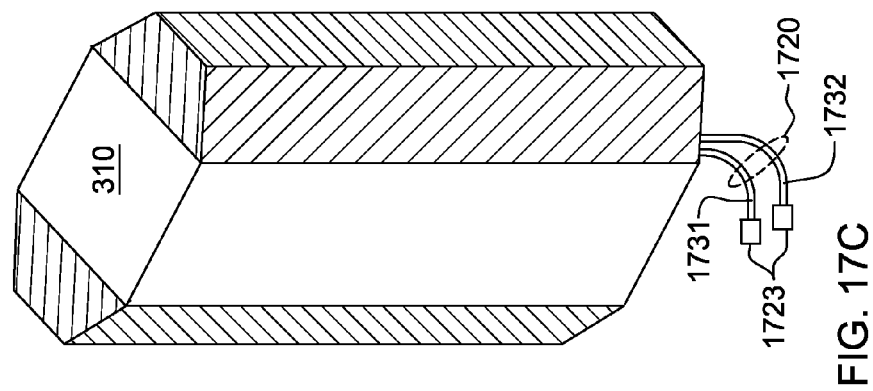
FIG. 17C depicts one embodiment of a second electronics rack of a multi-rack assembly, in accordance with one or more aspects of the present invention.
Figure 17B:
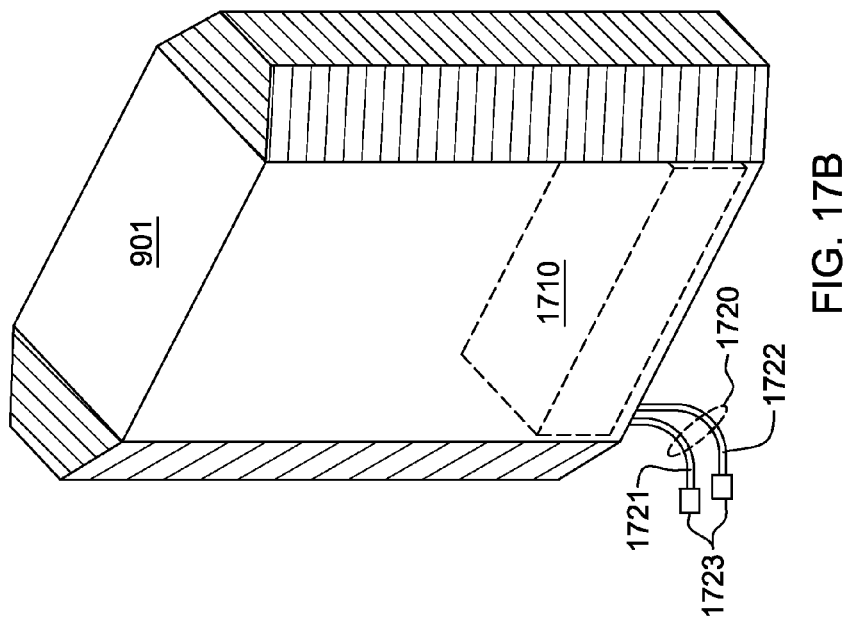
FIG. 17B depicts one embodiment of a first, liquid-cooled electronics rack of a multi-rack assembly, in accordance with one or more aspects of the present invention.

As illustrated in FIGS. 17B & 17C, first, liquid-cooled electronics rack 901 includes one or more cooling units 1710 providing liquid coolant via a primary coolant loop (not shown) within liquid-cooled electronics rack 901 to, at least in part, facilitate extraction of heat by one or more liquid-cooled structures (not shown) disposed within one or more electronic subsystems of the electronics rack and in thermal contact with one or more electronic components of the liquid-cooled electronics rack 901. These components are also referred to herein as first rack electronic components. The primary coolant loop couples in fluid communication the cooling unit(s) 1710, and the liquid-cooled structures. In addition, a secondary coolant loop 1720, also referred to herein as a second, external coolant loop, is provided.

As illustrated in FIG. 17B, secondary coolant loop 1720 extends from first, liquid-cooled electronics rack 901 and is in fluid communication with the one or more cooling units 1710 disposed therein. This secondary coolant loop comprises a coolant supply line 1721 and a coolant return line 1722, each of which includes, in one embodiment, quick disconnect couplers 1723 which facilitate coupling coolant supply line 1721 and coolant return line 1722 to coolant supply line 1731 and coolant return line 1732 of the secondary coolant loop 1720 portion associated with the second electronics rack 310, in this example. Thus, in this embodiment, the secondary coolant loop resides partially within the first, liquid-cooled electronics rack and partially within the second electronics rack, and coupling of the two portions of the secondary coolant loop together via, for example, the quick connect couplers 1723, results in an assembly wherein the first electronics rack and second electronics rack are tied together via the secondary coolant loop. Note that in one embodiment, the second electronics rack may be disposed adjacent to a side of the first electronics rack to, for example, minimize the length of the secondary coolant loop lines.

Figure 18A:
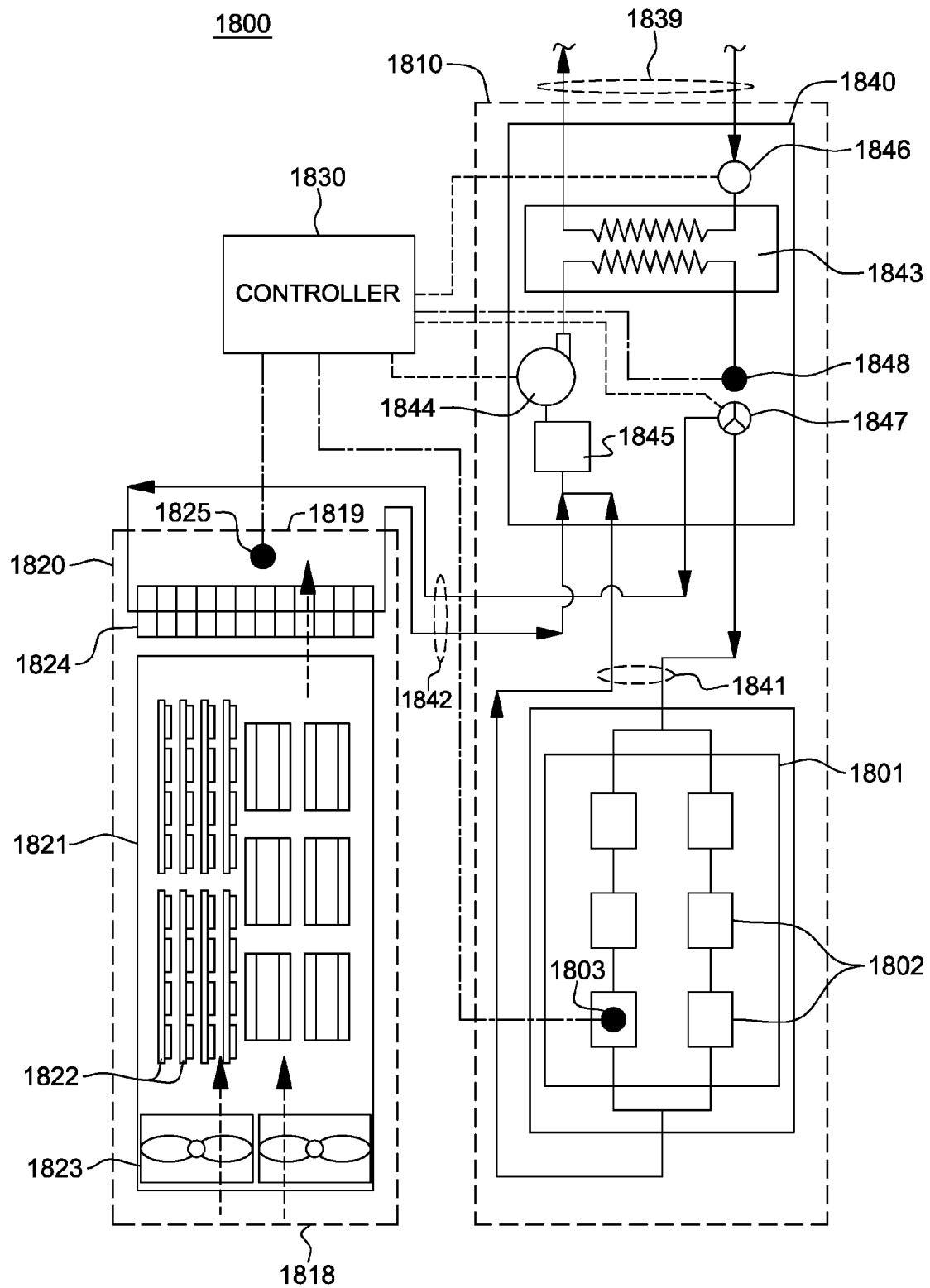
FIG. 18A is a schematic of one embodiment of a multi-rack assembly, in accordance with one or more aspects of the present invention.
Figure 18B:
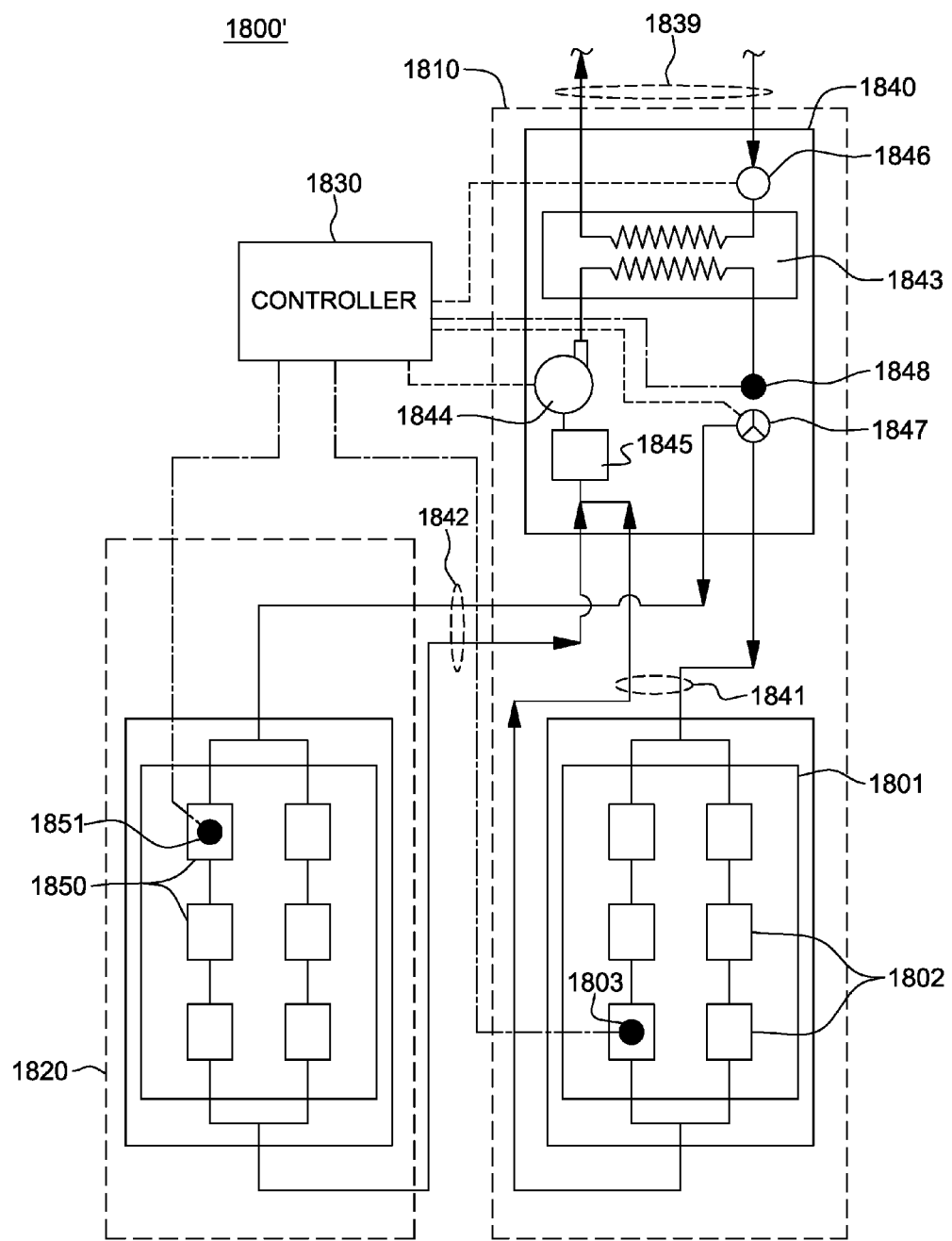
FIG. 18B is a schematic of another embodiment of a multi-rack assembly, in accordance with one or more aspects of the present invention.

FIGS. 18A & 18B schematically illustrate alternate embodiments of multi-rack assemblies 1800, 1800', respectively, in accordance with one or more aspects of the present invention. Unless otherwise indicated, the multi-rack assembly and embodiments of FIGS. 18A & 18B are substantially identical.

Referring first to the multi-rack assembly 1800 of FIG. 18A, the assembly is shown to include a first, liquid-cooled electronics rack 1810 and a second electronics rack 1820, which in the embodiment depicted, comprises an air-cooled electronics rack wherein air ingresses via an air inlet side 1818, flows across one or more second rack electronic components 1822 disposed within one or more electronic subsystems 1821 of second electronics rack 1820 and egresses from an air outlet side 1819 of the electronics rack. In this embodiment, one or more air-moving devices 1823 are provided within second electronics rack 1820 to facilitate airflow from the air inlet side 1818 to the air outlet side 1819. In this embodiment, the second heat exchange assembly of the second electronics rack 1820 comprises an air-to-liquid heat exchanger 1824, disposed at the air outlet side of the electronics rack to facilitate extracting heat generated within second electronics rack 1820 by removing the heat from air egressing from the air outlet side of the electronics rack.

The first, liquid-cooled electronics rack 1810 includes one or more electronic subsystems 1801 and one or more first rack electronic components (not shown) to which, in one embodiment, one or more liquid-cooled structures 1802 (or cold plates) are coupled to facilitate extraction by thermal conduction of heat generated by the one or more first rack electronic components.

The cooling apparatus further includes: one or more cooling units 1840 disposed within first, liquid-cooled electronics rack 1810; a primary coolant loop 1841; and a secondary coolant loop 1842, each coupled in fluid communication with the one or more cooling units 1840 via, for example, a three-way diverter valve 1847. As illustrated, cooling unit 1840 includes, in one embodiment, a liquid-to-liquid heat exchanger 1843, one or more coolant pumps 1844, and a reservoir 1845. The liquid-to-liquid heat exchanger 1843 includes a first coolant path and a second coolant path therethrough. The first coolant path is coupled to a facility coolant loop 1839 to receive chilled facility coolant from a source. A flow control throttling valve 1846 is provided in fluid communication with the first coolant path through the liquid-to-liquid heat exchanger 1843 to facilitate automated control of the flow of chilled facility coolant through the liquid-to-liquid heat exchanger, as explained herein. As illustrated in FIG. 18A, a controller 1830 is provided coupled to the flow control throttling valve 1846, the system coolant diverter valve 1847, and the coolant pump 1844 to automatically, dynamically adjust facility coolant flow through the liquid-to-liquid heat exchanger, and system coolant flow through the primary coolant loop 1841 and secondary coolant loop 1842, as explained herein. Controller 1830 is further coupled to receive temperature readings from a system coolant temperature sensor 1848, a liquid-cooled structure temperature sensor 1803 (or, alternatively, a temperature sensor associated with, for example, one or more critical first rack electronic components of the first electronics rack), and an exhaust air temperature sensor 1825 disposed at the air egress side of air-to-liquid heat exchanger 1824 of second electronics rack 1820.

As noted above, and as explained further below, controller 1830 dynamically controls flow of system coolant within primary coolant loop 1841, and secondary coolant loop 1842, to ensure first that cooling requirements of the first electronics rack 1810 are met, and then to provide any excess cooling capacity to the second electronics rack 1820. This can be achieved, in one specific embodiment, via the control process example of FIGS. 19A-19C, described below.

FIG. 18B illustrates an alternate embodiment of a multi-rack assembly 1800' that is substantially identical to multi-rack assembly 1800 of FIG. 18A, with the exception that the second heat exchange assembly in the second electronics rack 1820 in the embodiment of FIG. 18B comprises one or more liquid-cooled structures 1850 (or cold plates), rather than an air-to-liquid heat exchanger, as in the embodiment of FIG. 18A. Further, controller 1830 is coupled to read one or more sensed temperatures 1851 from one or more temperature sensors associated with the liquid-cooled structures 1850 (or, alternatively, associated with the one or more second rack electronic components to which the liquid-cooled structures 1850 are coupled). Note that in a further embodiment, second electronics rack 1820 may comprise both an air-to-liquid heat exchanger and one or more liquid-cooled structures coupled to one or more second rack electronic components to be cooled. In a still further embodiment of a multi-rack assembly, the first electronics rack 1810 may comprise an air-to-liquid heat exchanger (not shown) disposed, for example, at an air inlet side or an air outlet side of the electronics rack. Note that in the examples depicted in FIGS. 18A & 18B, the first electronics rack is a liquid-cooled electronics rack for which substantially all heat extracted from the first electronics rack is transferred to system coolant flowing through the primary coolant loop, and subsequently rejected to facility coolant within the facility coolant loop coupled to the liquid-to-liquid heat exchanger(s) of the one or more cooling units for removal from the first electronics rack.

Figure 19A:
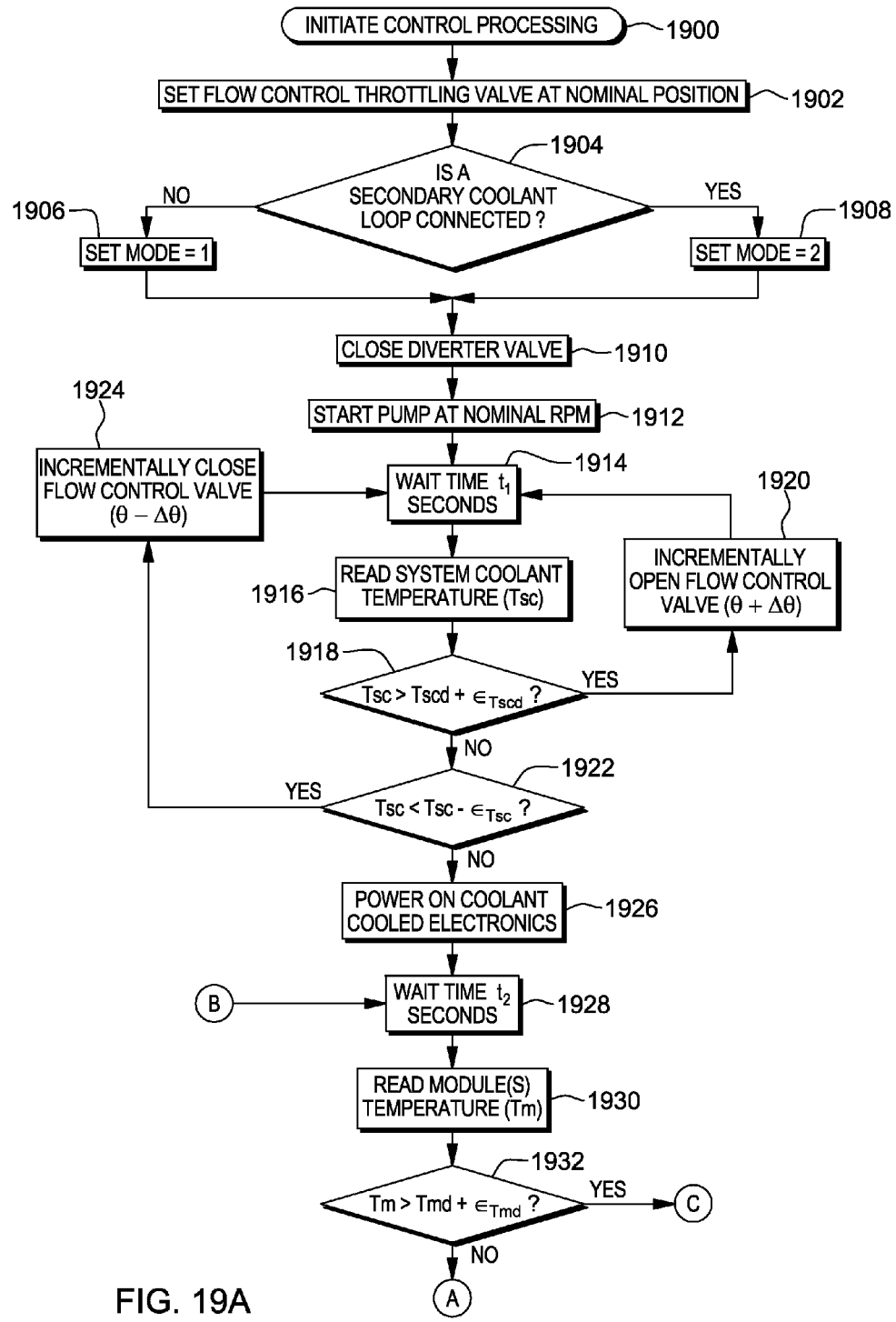
FIGS. 19A-19C depict one embodiment of a process for controlling coolant flow through the primary coolant loop of the first, liquid-cooled electronics rack of the multi-rack assembly of FIG. 18A, and the secondary coolant loop of the second electronics rack of the multi-rack assembly, in accordance with one or more aspects of the present invention.
Figure 19B:
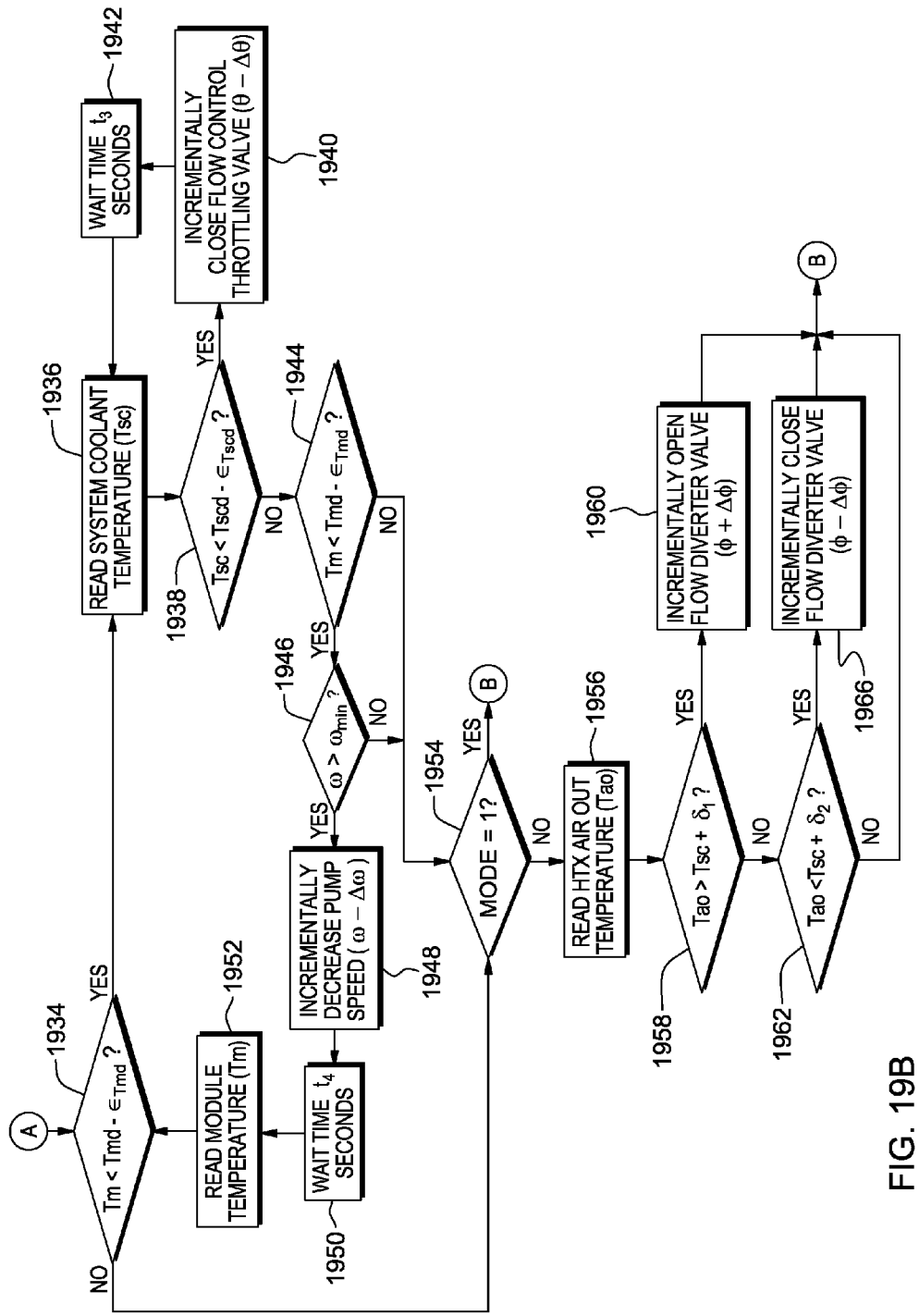
Figure 19C:
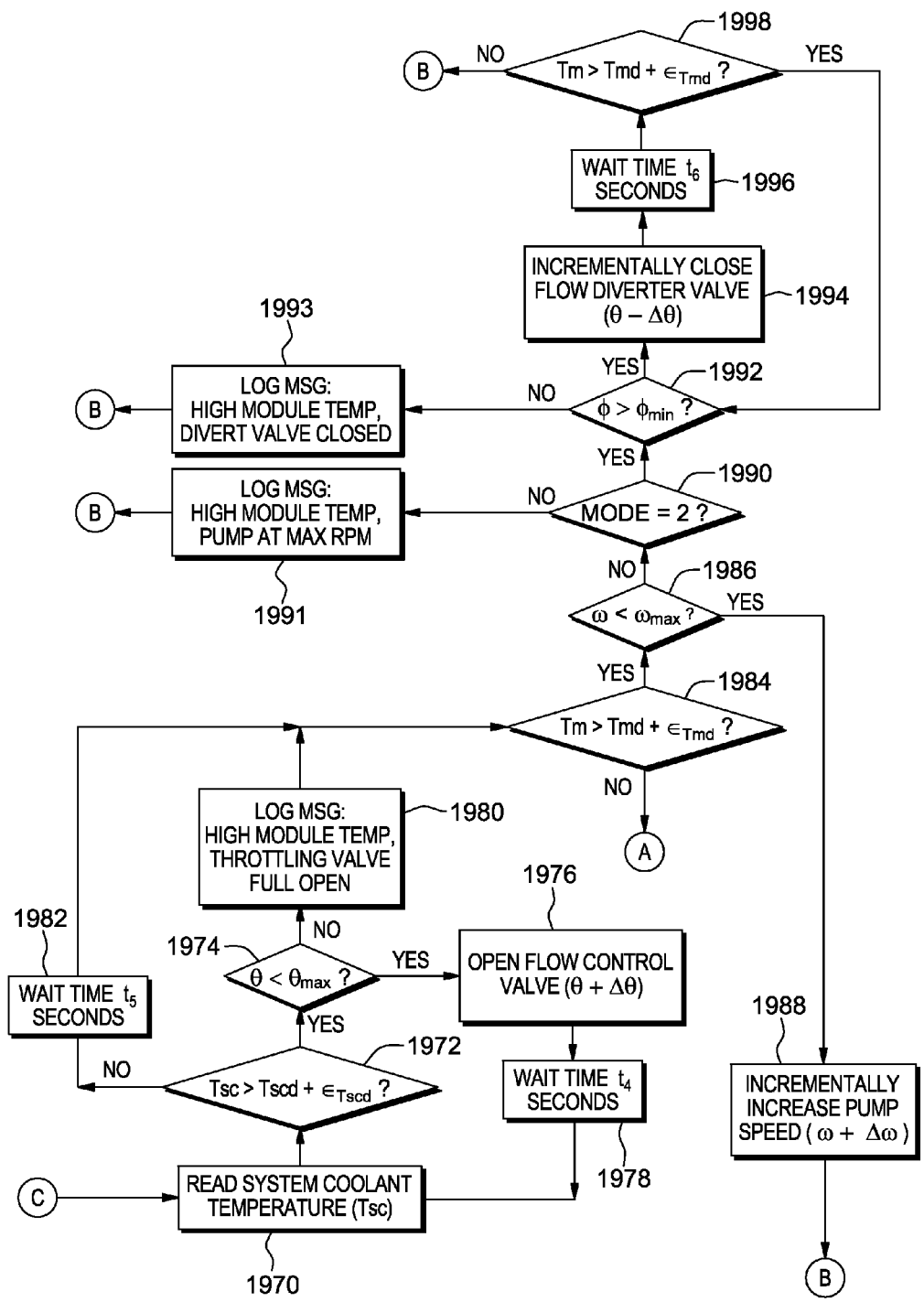

By way of example, FIGS. 19A-19C depict one embodiment of a control process implemented by a controller, such as controller 1830 in the multi-rack assembly embodiment of FIG. 18A. Beginning with FIG. 19A, upon initiation of control processing 1900, the controller sets the flow control throttling valve 1846 (see FIG. 18A) to a nominal position 1902, and determines whether a secondary coolant loop 1842 (FIG. 18A) is connected to the cooling unit to receive cooled system coolant 1904. If "no", then processing sets the control mode equal to "1" 1906, and if "yes", processing sets the control mode equal to "2" 1908, and thereafter closes the three-way diverter valve (1847 in FIG. 18A) 1910.

After closing the diverter valve, the controller starts the one or more coolant pumps of the coolant unit at a nominal speed (or nominal RPMs) 1912, and waits a time interval $t_1$ seconds 1914 to allow system coolant to reach an equilibrium temperature. The controller then reads the system coolant temperature (Tsc) 1916 and determines whether the system coolant temperature is greater than a desired system coolant temperature (Tscd) plus a specified acceptable operating offset ($\epsilon_{Tscd}$) 1918. If "yes", then the controller incrementally opens the flow control throttling valve by a specified amount ($\Delta\theta$) 1920, and returns to wait time interval $t_1$ 1914 before again reading the system coolant temperature (Tsc) 1916. If the read system coolant temperature (Tsc) is not greater than the desired temperature (Tscd) plus the specified offset ($\epsilon_{Tscd}$), then the controller determines whether the read system coolant is below the desired system coolant temperature (Tscd) minus the specified offset ($\epsilon_{Tscd}$) 1922. If "yes", then the controller incrementally closes the throttling valve 1924 by a specified amount ($\Delta\theta$), and returns to wait time interval $t_1$ 1914 before again reading the system coolant temperature (Tsc) 1916.

Assuming that the system coolant temperature is within the operating range specified by the desired system coolant temperature (Tscd) plus and minus the specified offset ($\epsilon_{Tscd}$), then the controller powers on the coolant-cooled first rack electronic components and, in one embodiment, the second rack electronic components 1926. After powering on the first rack electronic components, the controller waits a second time interval $t_2$ 1928 before reading one or more module temperatures (Tm) 1930. In one embodiment, the one or more module temperatures comprise a temperature associated with one or more of the first rack electronic components (or modules) and/or one or more liquid-cooled structures (or cold plates) coupled to the one or more first rack electronic components. In one specific example, the read temperature module is a temperature of a critical component within the first electronics rack. Processing then determines whether the read module temperature (Tm) is greater than a desired module temperature (Tmd) plus a specified acceptable temperature offset ($\epsilon_{Tmd}$) 1932.

If "no", then processing determines whether the read module temperature (Tm) is less than the desired module temperature (Tmd) minus the specified offset ($\epsilon_{Tmd}$) 1934. If "yes", then the controller reads the system coolant temperature (Tsc) 1936 and determines whether the current system coolant temperature is less than the desired system coolant temperature (Tscd) minus the specified offset ($\epsilon_{Tscd}$) 1938. If "yes", the controller incrementally closes the flow control throttling valve by a specified amount, for example, $\Delta\theta$ 1940, and waits a time interval $t_3$ seconds 1942 before again reading the system coolant temperature (Tsc) 1936. Provided that the system coolant temperature is greater than or equal to the desired system coolant temperature minus the specified offset, then processing determines whether the module temperature (Tm) is less than the desired module temperature (Tmd) less its specified acceptable offset ($\epsilon_{Tmd}$) 1944. If "yes", then processing determines whether pump operating speed ($\omega$) is greater than or equal to a minimum acceptable operating speed ($\omega_{min}$) 1946. If "yes", then the controller incrementally decreases the pump speed by a set amount, for example, $\Delta\omega$ 1948, and waits a time interval $t_4$ 1950 before again reading the module temperature (Tm) 1952 and determining whether the module temperature is less than the desired module temperature (Tmd) minus the specified acceptable offset ($\epsilon_{Tmd}$) 1934. If the module temperature is greater than or equal to the desired module temperature (Tmd) minus the specified offset ($\epsilon_{Tmd}$) 1934, 1944, or if the operating pump speed ($\omega$) is not greater than the minimum operating speed ($\omega_{min}$) 1946, processing determines whether the control mode is control mode 1 1954. If "yes", the controller returns to wait time $t_2$ seconds 1928 before again reading the module temperature (Tm), and repeating the above-described process.

Assuming that the control mode is other than control mode 1, that is, is set to control mode 2, meaning that there is a secondary coolant loop connected to the cooling unit(s) in the first electronics rack, then (in one embodiment) the controller reads the air-to-liquid heat exchanger air outlet temperature (Tao) 1956 and determines whether this air outlet temperature is greater than the system coolant temperature (Tsc) plus a first, upper acceptable $\delta$ value ($\delta_1$) 1958. If "yes", then the controller incrementally opens the flow diverter valve by a specified amount ($\Delta\phi$) 1960 before waiting time interval $t_2$ 1928 and reading the module temperature (Tm) 1930 associated with the first rack electronic component being cooled. Alternatively, if the read air temperature (Tao) is not greater than the system coolant temperature (Tsc) plus the upper specified $\delta_1$ value, the controller determines whether the read air temperature (Tao) is less than the system coolant temperature (Tsc) plus a second, lower specified $\delta$ value ($\delta_2$) 1962, wherein $\delta_1 > \delta_2$. If "yes", then the controller incrementally closes the flow diverter valve by a set amount ($\Delta\phi$) 1966, before returning to wait time interval $t_2$ 1928 and then reading the module temperature (Tm) 1930 associated with the first rack electronic component being cooled.

Figure 20:
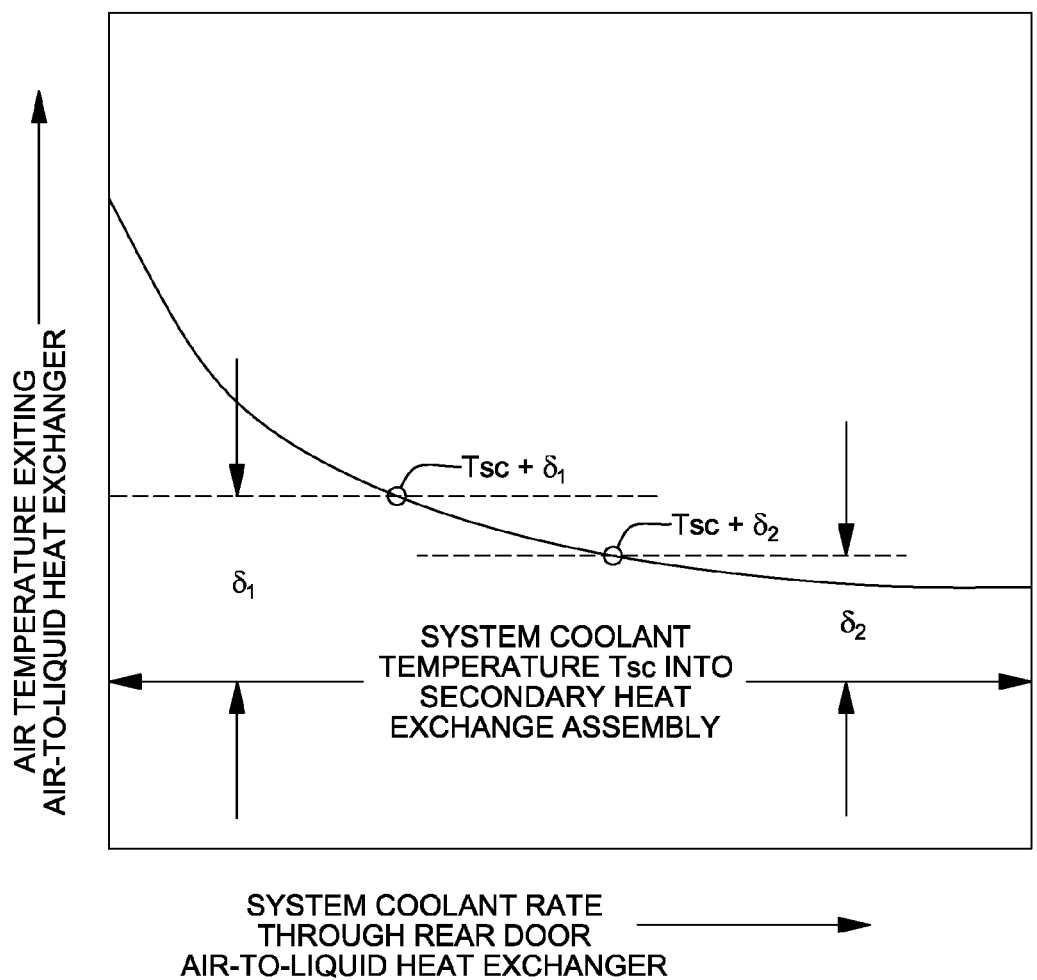
FIG. 20 graphically depicts for the multi-rack assembly of FIG. 18A, air temperature exiting the air-to-liquid heat exchanger of the second electronics rack versus cooled coolant flow rate through the air-to-liquid heat exchanger, in accordance with one or more aspects of the present invention.

This control band (Tsc+$\delta_1$ to Tsc+$\delta_2$) is illustrated in FIG. 20, wherein air temperature exiting the air-to-liquid heat exchanger at the air outlet side of the second electronics rack is plotted versus system coolant flow rate through the air-to-liquid heat exchanger. As expected, the exit air temperature decreases as system coolant flow rate increases. As shown in FIG. 20, at higher system coolant flow rates, the exit air temperature asymptotically approaches a fixed value above the system coolant inlet temperature. How far the asymptote is above the system coolant inlet temperature will be determined by the thermodynamic effectiveness of the heat exchanger. As noted, the control band displayed in the process control of FIGS. 19A-19C for the exit air temperature is set between Tsc+$\delta_1$ and Tsc+$\delta_2$, with $\delta_1 > \delta_2$. As illustrated in FIG. 20, operating below the control band would require increasingly greater flow rates to obtain decreasingly lower reductions in exit air temperature. Since the power required to drive the coolant pump is proportional to the cube of the flow rate through the coolant pump, operating below the control band would be inefficient and wasteful from a required energy perspective.

Returning to inquiry 1932, if the module temperature is greater than the desired module temperature (Tmd) plus the specified acceptable offset ($\epsilon_{Tmd}$), then the controller reads current system coolant temperature (Tsc) 1970 and determines whether the system coolant temperature (Tsc) is greater than the desired system coolant temperature (Tscd) plus the specified acceptable offset ($\epsilon_{Tscd}$) 1972. If "yes", then processing determines whether the flow control throttling valve is at less than a maximum open valve setting ($\theta_{max}$) 1974, and if "yes", then the flow control throttling valve is opened by a specified amount ($\Delta\theta$) 1976, and the controller waits time $t_4$ seconds 1978 before again reading the system coolant temperature (Tsc) 1970. If the flow control throttling valve is already at the maximum open setting ($\theta_{max}$), then from inquiry 1974, processing logs or records a message: "high module temperature, throttling valve full open" 1980 before continuing. Alternatively, if the system coolant temperature read is not greater than the desired system coolant temperature (Tscd) plus the specified acceptable offset ($\epsilon_{Tscd}$), then from inquiry 1972, processing waits a time interval $t_5$ seconds 1982 before continuing, by determining whether the module temperature (Tm) is greater than the desired module temperature (Tmd) plus the specified acceptable offset ($\epsilon_{Tmd}$) 1984. If "no", then the module temperature is within the upper range, and processing returns to inquiry 1934 to determine whether the module temperature is within the lower desired temperature range. Alternatively, if the module temperature is above the desired module temperature plus the specified offset, then processing determines whether the coolant pump speed ($\omega$) is less than the maximum coolant pump speed ($\omega_{max}$) 1986, and if "yes", incrementally increases the pump speed by $\Delta\omega$ to increase flow of system coolant through the primary coolant loop 1988, after which processing returns to wait time $t_2$ 1928 before again reading the module temperature (Tm) 1930 associated with the first rack electronic component being cooled.

Assuming that the coolant pump is at maximum speed, then processing determines whether the control mode equals mode 2 1990, meaning that the secondary coolant loop is attached to the cooling unit. If "no", then processing logs a message: "high module temperature, coolant pump at maximum RPMs" 1991, and returns to wait time interval $t_2$ 1928 before again reading the module temperature. If the control mode is control mode 2, then processing determines whether the flow diverter valve is open more than a minimum specified amount ($\phi_{min}$) 1992. By way of example, $\phi_{min}$ might comprise fully closed. If "no", then processing logs a message: "high module temperature, diverter valve closed" 1993, before returning to wait time interval $t_2$ 1928, and again reading the module temperature (Tm) 1930. Assuming that processing is in control mode 2 and the diverter valve is not closed, then processing incrementally closes the flow diverter valve by a specified amount ($\Delta\phi$) 1994, after which processing waits a time interval $t_6$ seconds 1996 before determining whether the module temperature (Tm) is greater than the desired module temperature (Tmd) plus the specified acceptable offset ($\epsilon_{md}$) 1998. If "yes", processing returns to determine whether the flow diverter valve setting ($\phi$) is greater than the minimum specified setting ($\phi_{min}$) 1992. Alternatively, if the module temperature is not greater than the desired module temperature (Tmd) plus the specified offset ($\epsilon_{Tmd}$), then processing waits time $t_2$ 1928 before again reading the module temperature (Tm) 1930.

As will be appreciated by one skilled in the art, control aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 21:
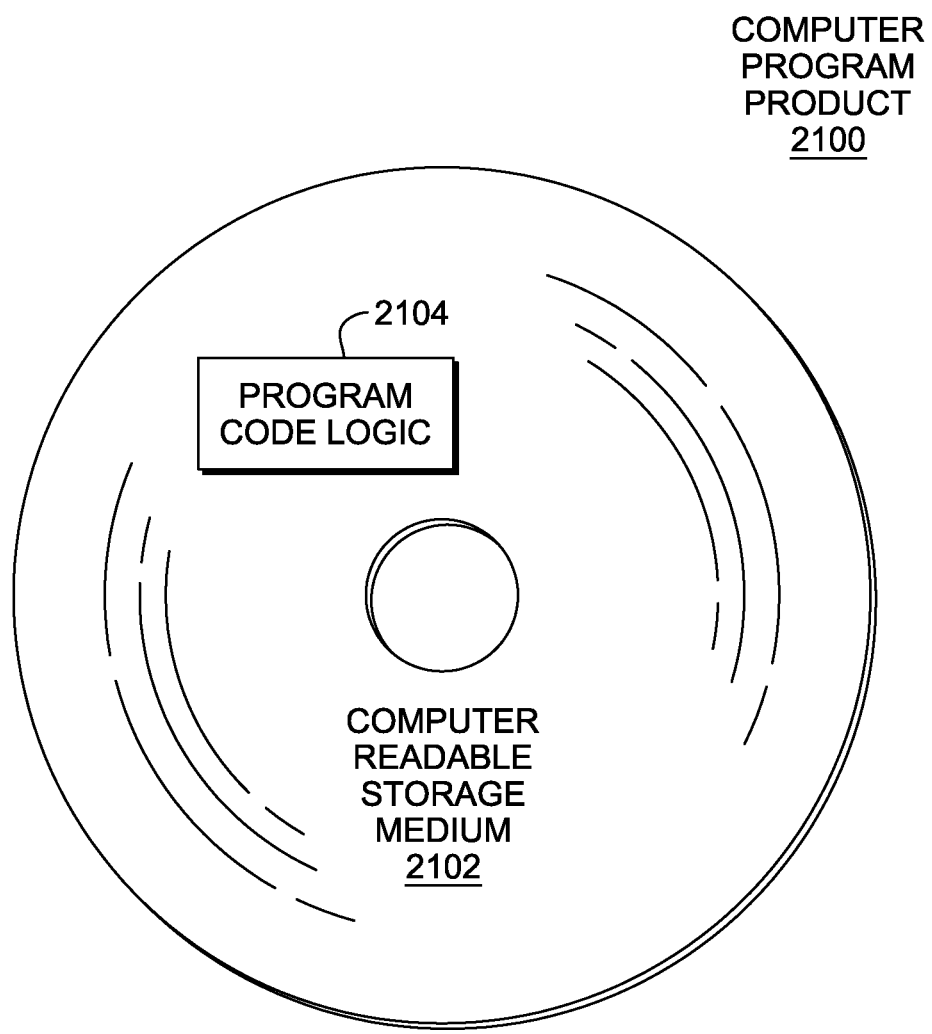
FIG. 21 depicts one embodiment of computer program product incorporating one or more aspects of the present invention.

Referring now to FIG. 21, in one example, a computer program product 2100 includes, for instance, one or more computer readable storage media 2102 to store computer readable program code means or logic 2104 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples.

Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A multi-rack assembly comprising:
a first electronics rack, the first electronics rack comprising:
at least one first rack electronic component to be cooled;
at least one cooling unit disposed within the first electronics rack and coupled in fluid communication with a primary coolant loop in the first electronics rack to, at least in part, facilitate cooling of the at least one first rack electronic component of the first electronics rack, the at least one cooling unit providing cooled coolant to the primary coolant loop; and
a second electronics rack, the second electronics rack comprising:
a secondary coolant loop, the secondary coolant loop being coupled in fluid communication with the at least one cooling unit disposed within the first electronics rack, wherein the at least one cooling unit disposed within the first electronics rack provides cooled coolant to the secondary coolant loop to, at least in part, facilitate extracting heat generated within the second electronics rack; and
a controller to automatically control flow of cooled coolant from the at least one cooling unit in the first electronic rack to the secondary coolant loop of the second electronics rack depending, at least in part, on cooling requirements of the first electronics rack.

2. The multi-rack assembly of claim 1, wherein the first electronics rack comprises a first heat exchange assembly and the second electronics rack comprises a second heat exchange assembly, the primary coolant loop being coupled in fluid communication with the first heat exchange assembly, and the secondary coolant loop being coupled in fluid communication with the second heat exchange assembly, and wherein the controller further automatically controls flow of cooled coolant from the at least one cooling unit in the first electronics rack to the secondary coolant loop of the second electronics rack depending, at least in part, on a temperature associated with the second electronics rack.

3. The multi-rack assembly of claim 2, wherein the second heat exchange assembly comprises an air-to-liquid heat exchanger disposed at an air outlet side of the second electronics rack, wherein air moves through the second electronics rack from an air inlet side to the air outlet side thereof, and wherein the controller further automatically controls flow of cooled coolant from the at least one cooling unit in the first electronics rack to the secondary coolant loop of the second electronics rack depending, at least in part, on a temperature of air passing across the air-to-liquid heat exchanger disposed at the air outlet side of the second electronics rack.

4. The multi-rack assembly of claim 2, wherein the second heat exchange assembly comprises a liquid-cooled cold plate coupled to at least one second rack electronic component of the second electronics rack, the liquid-cooled cold plate being in fluid communication with the secondary coolant loop, and wherein the controller further automatically controls flow of cooled coolant from the at least one cooling unit in the first electronics rack to the secondary coolant loop of the second electronics rack depending, at least in part, on a temperature associated with at least one of the liquid-cooled cold plate or the at least one second rack electronic component.

5. The multi-rack assembly of claim 1, wherein the controller automatically controls flow of cooled coolant from the at least one cooling unit in the first electronics rack to the secondary coolant loop of the second electronics rack so that, at least in part, a temperature associated with the at least one first rack electronic component of the first electronics rack remains within a specified operating range.

6. The multi-rack assembly of claim 5, wherein one cooling unit of the at least one cooling unit comprises a liquid-to-liquid heat exchanger with a first coolant path and a second coolant path therethrough, the first coolant path of the one cooling unit receiving chilled facility coolant from a source and passing at least a portion thereof through the liquid-to-liquid heat exchanger, and the second coolant path being coupled in fluid communication with the primary coolant loop and the secondary coolant loop via a three-way diverter valve, the controller automatically controlling a valve setting of the three-way diverter valve, and wherein the liquid-to-liquid heat exchanger expels heat from coolant flowing through the primary coolant loop and the secondary coolant loop to the chilled facility coolant in the first coolant path.

7. The multi-rack assembly of claim 6, wherein the one cooling unit of the at least one cooling unit further comprises a coolant pump coupled in fluid communication with the second coolant path of the liquid-to-liquid heat exchanger and coupled in fluid communication with the primary coolant path and the secondary coolant path across the three-way diverter valve, and wherein the controller further controls speed of the coolant pump to maintain the temperature associated with the at least one first rack electronic component of the first electronics rack within the specified operating range for the valve setting of the three-way diverter valve by adjusting flow of cooled coolant through the primary coolant loop of the first electronics rack.

8. The multi-rack assembly of claim 6, further comprising a flow control throttling valve coupled in fluid communication with the first coolant path of the liquid-to-liquid heat exchanger of the one cooling unit, and wherein the controller is coupled to the flow control throttling valve to automatically adjust flow of chilled facility coolant through the first coolant path of the liquid-to-liquid heat exchanger based, at least in part, on a temperature of coolant passing through the second coolant path of the liquid-to-liquid heat exchanger.

9. The multi-rack assembly of claim 1, wherein the controller automatically prioritizes providing cooled coolant to the primary coolant loop of the first electronics rack over providing cooled coolant to the secondary coolant loop of the second electronics rack, and provides cooled coolant to the secondary coolant loop of the second electronics rack responsive to cooling requirements of the first electronics rack being met.

10. The multi-rack assembly of claim 1, wherein the first electronics rack and the second electronics rack comprise distinct electronics racks, free-standing from each other.

11. A cooling apparatus comprising:
a first heat exchange assembly configured to mount within a first electronics rack to facilitate extraction of heat generated within the first electronics rack;
a second heat exchange assembly configured to mount to a second electronics rack to facilitate extraction of heat generated within the second electronics rack;
a primary coolant loop coupled in fluid communication with the first heat exchange assembly and a secondary coolant loop coupled in fluid communication with the second heat exchange assembly;
at least one cooling unit configured to mount within the first electronics rack and coupled in fluid communication with the primary coolant loop and the secondary coolant loop, the at least one cooling unit providing cooled coolant to the primary coolant loop to facilitate extraction by the first heat exchange assembly of heat generated within the first electronics rack; and
a controller to automatically control flow of cooled coolant from the at least one cooling unit in the first electronics rack through the secondary coolant loop to the second heat exchange assembly of the second electronics rack depending, at least in part, on cooling requirements of the first electronics rack.

12. The cooling apparatus of claim 11, wherein the controller further automatically controls flow of cooled coolant from the at least one cooling unit in the first electronics rack to the secondary coolant loop of the second electronics rack depending, at least in part, on a temperature associated with the second electronics rack.

13. The cooling apparatus of claim 12, wherein the second heat exchange assembly comprises an air-to-liquid heat exchanger configured to mount to an air outlet side of the second electronics rack, and wherein air moves through the second electronics rack from an air inlet side to the air outlet side thereof, and wherein the controller further automatically controls flow of cooled coolant from the at least one cooling unit in the first electronics rack to the secondary coolant loop of the second electronics rack depending, at least in part, on a temperature of air passing across the air-to-liquid heat exchanger mounted to the air outlet side of the second electronics rack.

14. The cooling apparatus of claim 12, wherein the second heat exchange assembly comprises a liquid-cooled cold plate configured to couple to at least one second rack electronic component of the second electronics rack, the liquid-cooled cold plate being in fluid communication with the secondary coolant loop, and wherein the controller further automatically controls flow of cooled coolant from the at least one cooling unit in the first electronics rack to the secondary coolant loop of the second electronics rack depending, at least in part, on a temperature associated with at least one of the liquid-cooled cold plate or the at least one second rack electronic component.

15. The cooling apparatus of claim 11, wherein the controller automatically controls flow of cooled coolant from the at least one cooling unit in the first electronics rack to the secondary coolant loop of the second electronics rack so that, at least in part, a temperature associated with at least one first rack electronic component of the first electronics rack remains within a specified operating range.

16. The cooling apparatus of claim 15, wherein one cooling unit of the at least one cooling unit comprises a liquid-to-liquid heat exchanger with a first coolant path and a second coolant path therethrough, the first coolant path of the one cooling unit receiving chilled facility coolant from a source and passing at least a portion thereof through the liquid-toliquid heat exchanger, and the second coolant path being coupled in fluid communication with a primary coolant loop and a secondary coolant loop via a three-way diverter valve, the controller automatically controlling a valve setting of the three-way diverter valve, and wherein the liquid-to-liquid heat exchanger expels heat from coolant flowing through the primary coolant loop and the secondary coolant loop to the chilled facility coolant in the first coolant path of the liquid-to-liquid heat exchanger.

17. The cooling apparatus of claim 16, wherein the one cooling unit of the at least one cooling unit further comprises a coolant pump coupled in fluid communication with the second coolant path of the liquid-to-liquid heat exchanger and coupled in fluid communication with the primary coolant path and the secondary coolant path across the three-way diverter valve, and wherein the controller further controls speed of the coolant pump to maintain the temperature associated with the at least one first rack electronic component of the first electronics rack within the specified operating range for the valve setting of the three-way diverter valve by adjusting flow of cooled coolant through the primary coolant loop of the first electronics rack.

18. The cooling apparatus of claim 16, further comprising a flow control throttling valve coupled in fluid communication with the first coolant path of the liquid-to-liquid heat exchanger of the one cooling unit, and wherein the controller is coupled to the flow control throttling, valve to automatically adjust flow of chilled facility coolant through the first coolant path of the liquid-to-liquid heat exchanger based, at least in part, on a temperature of coolant passing through the second coolant path of the liquid-to-liquid heat exchanger.

19. The cooling apparatus of claim 11, wherein the controller automatically prioritizes providing cooled coolant to the primary coolant loop of the first electronics rack over providing cooled coolant to the secondary coolant loop of the second electronics rack, and provides cooled coolant to the secondary coolant loop of the second electronics rack responsive to cooling requirements of the first electronics rack being met.

* * * * *